(12) United States Patent
Seo et al.

(10) Patent No.: US 9,406,709 B2
(45) Date of Patent: Aug. 2, 2016

(54) METHODS FOR FABRICATING AND USING NANOWIRES

(75) Inventors: Kwanyong Seo, Cambridge, MA (US); Paul Steinvurzel, Boston, MA (US); Ethan Schonbrun, Newton Highlands, MA (US); Munib Wober, Topsfield, MA (US); Kenneth B. Crozier, Cambridge, MA (US)

(73) Assignees: PRESIDENT AND FELLOWS OF HARVARD COLLEGE, Cambridge, MA (US); ZENA TECHNOLOGIES, INC., Cambridge, MA (US)

( * ) Notice: Subject to any disclaimer, the term of this patent is extended or adjusted under 35 U.S.C. 154(b) by 165 days.

(21) Appl. No.: 12/966,514

(22) Filed: Dec. 13, 2010

(65) Prior Publication Data

US 2011/0309233 A1    Dec. 22, 2011

Related U.S. Application Data

(60) Provisional application No. 61/357,429, filed on Jun. 22, 2010.

(51) Int. Cl.
*H01L 27/146* (2006.01)
*B82Y 20/00* (2011.01)
*B82Y 30/00* (2011.01)
*B82Y 40/00* (2011.01)

(52) U.S. Cl.
CPC .......... *H01L 27/14629* (2013.01); *B82Y 20/00* (2013.01); *B82Y 30/00* (2013.01); *B82Y 40/00* (2013.01)

(58) Field of Classification Search
USPC ............ 250/214.1, 214 R; 257/448; 977/742, 977/932, 933, 954
See application file for complete search history.

(56) References Cited

U.S. PATENT DOCUMENTS

| 1,918,848 | A | 4/1929 | Land |
| 3,903,427 | A | 9/1975 | Pack |
| 4,017,332 | A | 4/1977 | James |
| 4,292,512 | A | 9/1981 | Miller |
| 4,316,048 | A | 2/1982 | Woodall |

(Continued)

FOREIGN PATENT DOCUMENTS

| CN | 1624925 | 6/2005 |
| CN | 1306619 | 3/2007 |

(Continued)

OTHER PUBLICATIONS

Berstein et al. "Modern Physics", Chapter 14, Section 6, pp. 420-421. 2000 by Prentice-Hall, Inc.*

(Continued)

*Primary Examiner* — Francis M Legasse, Jr.
(74) *Attorney, Agent, or Firm* — Pillsbury Winthrop Shaw Pittman LLP

(57) ABSTRACT

Methods, apparatuses, systems, and devices relating to fabricating one or more nanowires are disclosed. One method for fabricating a nanowire includes: selecting a particular wavelength of electromagnetic radiation for absorption for a nanowire; determining a diameter corresponding to the particular wavelength; and fabricating a nanowire having the determined diameter. According to another embodiment, one or more nanowires may be fabricated in an array, each having the same or different determined diameters. An image sensor and method of imaging using such an array are also disclosed.

20 Claims, 15 Drawing Sheets

(56) References Cited

U.S. PATENT DOCUMENTS

| | | |
|---|---|---|
| 4,357,415 A | 11/1982 | Hartman |
| 4,387,265 A | 6/1983 | Dalal |
| 4,394,571 A | 7/1983 | Jurisson |
| 4,400,221 A | 8/1983 | Rahilly |
| 4,443,890 A | 4/1984 | Eumurian |
| 4,513,168 A | 4/1985 | Borden |
| 4,531,055 A | 7/1985 | Shepherd, Jr. |
| 4,620,237 A | 10/1986 | Traino |
| 4,678,772 A | 7/1987 | Segal et al. |
| 4,827,335 A | 5/1989 | Saito |
| 4,846,556 A | 7/1989 | Haneda |
| 4,857,973 A | 8/1989 | Yang |
| 4,876,586 A | 10/1989 | Dyck |
| 4,880,613 A | 11/1989 | Satoh |
| 4,896,941 A | 1/1990 | Hayashi |
| 4,950,625 A | 8/1990 | Nakashima |
| 4,971,928 A | 11/1990 | Fuller |
| 4,972,244 A | 11/1990 | Buffet |
| 4,990,988 A | 2/1991 | Lin |
| 5,071,490 A | 12/1991 | Yokota |
| 5,081,049 A | 1/1992 | Green |
| 5,096,520 A | 3/1992 | Faris |
| 5,124,543 A | 6/1992 | Kawashima |
| 5,217,911 A | 6/1993 | Denda |
| 5,247,349 A | 9/1993 | Olego |
| 5,272,518 A | 12/1993 | Vincent |
| 5,311,047 A | 5/1994 | Chang |
| 5,347,147 A | 9/1994 | Jones |
| 5,362,972 A | 11/1994 | Yazawa |
| 5,374,841 A | 12/1994 | Goodwin |
| 5,391,896 A | 2/1995 | Wanlass |
| 5,401,968 A | 3/1995 | Cox |
| 5,449,626 A | 9/1995 | Hezel |
| 5,468,652 A | 11/1995 | Gee |
| 5,602,661 A | 2/1997 | Schadt |
| 5,612,780 A | 3/1997 | Rickenbach |
| 5,671,914 A | 9/1997 | Kalkhoran |
| 5,696,863 A | 12/1997 | Kleinerman |
| 5,723,945 A | 3/1998 | Schermerhorn |
| 5,747,796 A | 5/1998 | Heard |
| 5,767,507 A | 6/1998 | Unlu |
| 5,798,535 A | 8/1998 | Huang |
| 5,844,290 A | 12/1998 | Furumiya |
| 5,853,446 A | 12/1998 | Carre |
| 5,857,053 A | 1/1999 | Kane |
| 5,877,492 A | 3/1999 | Fujieda |
| 5,880,495 A | 3/1999 | Chen |
| 5,885,881 A | 3/1999 | Ojha |
| 5,900,623 A | 5/1999 | Tsang et al. |
| 5,943,463 A | 8/1999 | Unuma |
| 5,968,528 A | 10/1999 | Deckner et al. |
| 6,013,871 A | 1/2000 | Curtin |
| 6,033,582 A | 3/2000 | Lee |
| 6,037,243 A | 3/2000 | Ha et al. |
| 6,046,466 A | 4/2000 | Ishida et al. |
| 6,074,892 A | 6/2000 | Bowers et al. |
| 6,100,551 A | 8/2000 | Lee |
| 6,270,548 B1 | 8/2001 | Campbell |
| 6,301,420 B1 | 10/2001 | Greenaway |
| 6,326,649 B1 | 12/2001 | Chang |
| 6,388,243 B1 | 5/2002 | Berezin |
| 6,388,648 B1 | 5/2002 | Clifton |
| 6,407,439 B1 | 6/2002 | Hier |
| 6,459,034 B2 | 10/2002 | Muramoto et al. |
| 6,463,204 B1 | 10/2002 | Ati |
| 6,542,231 B1 | 4/2003 | Garrett |
| 6,563,995 B2 | 5/2003 | Kane |
| 6,566,723 B1 | 5/2003 | Vook |
| 6,680,216 B2 | 1/2004 | Kwasnick et al. |
| 6,709,929 B2 | 3/2004 | Zhang |
| 6,720,594 B2 | 4/2004 | Rahn |
| 6,771,314 B1 | 8/2004 | Bawolek |
| 6,805,139 B1 | 10/2004 | Savas |
| 6,812,473 B1 | 11/2004 | Amemiya |
| 6,904,187 B2 | 6/2005 | Fischer et al. |
| 6,927,145 B1 | 8/2005 | Yang |
| 6,960,526 B1 | 11/2005 | Shah |
| 6,967,120 B2 | 11/2005 | Jang |
| 6,969,899 B2 | 11/2005 | Yaung |
| 6,987,258 B2 | 1/2006 | Mates |
| 6,996,147 B2 | 2/2006 | Majumdar |
| 7,052,927 B1 | 5/2006 | Fletcher |
| 7,064,372 B2 | 6/2006 | Duan |
| 7,105,428 B2 | 9/2006 | Pan |
| 7,106,938 B2 | 9/2006 | Baek et al. |
| 7,109,517 B2 | 9/2006 | Zaidi |
| 7,153,720 B2 | 12/2006 | Augusto |
| 7,163,659 B2 | 1/2007 | Stasiak |
| 7,192,533 B2 | 3/2007 | Bakkers |
| 7,208,783 B2 | 4/2007 | Palsule |
| 7,230,286 B2 | 6/2007 | Cohen |
| 7,235,475 B2 | 6/2007 | Kamins |
| 7,241,434 B2 | 7/2007 | Anthony |
| 7,253,017 B1 | 8/2007 | Roscheisen |
| 7,254,151 B2 | 8/2007 | Lieber |
| 7,262,400 B2 | 8/2007 | Yaung |
| 7,265,328 B2 | 9/2007 | Mouli |
| 7,272,287 B2 | 9/2007 | Bise |
| 7,285,812 B2 | 10/2007 | Tang et al. |
| 7,306,963 B2 | 12/2007 | Linden |
| 7,307,327 B2 | 12/2007 | Bahl |
| 7,311,889 B2 | 12/2007 | Awano |
| 7,326,915 B2 | 2/2008 | Kaluzhny |
| 7,330,404 B2 | 2/2008 | Peng |
| 7,335,962 B2 | 2/2008 | Mouli |
| 7,336,860 B2 | 2/2008 | Cyr |
| 7,339,110 B1 | 3/2008 | Mulligan et al. |
| 7,358,583 B2 | 4/2008 | Reznik |
| 7,381,966 B2 | 6/2008 | Starikov |
| 7,388,147 B2 | 6/2008 | Mulligan |
| 7,416,911 B2 | 8/2008 | Heath et al. |
| 7,446,025 B2 | 11/2008 | Cohen |
| 7,462,774 B2 | 12/2008 | Roscheisen |
| 7,471,428 B2 | 12/2008 | Ohara |
| 7,491,269 B2 | 2/2009 | Legagneux |
| 7,507,293 B2 | 3/2009 | Li |
| 7,521,322 B2 | 4/2009 | Tang et al. |
| 7,524,694 B2 | 4/2009 | Adkisson |
| 7,582,857 B2 | 9/2009 | Gruev et al. |
| 7,598,482 B1 | 10/2009 | Verhulst |
| 7,622,367 B1 | 11/2009 | Nuzzo |
| 7,626,685 B2 | 12/2009 | Jin |
| 7,646,138 B2 | 1/2010 | Williams |
| 7,646,943 B1 | 1/2010 | Wober |
| 7,647,695 B2 | 1/2010 | MacNutt |
| 7,649,665 B2 | 1/2010 | Kempa et al. |
| 7,655,860 B2 | 2/2010 | Parsons |
| 7,663,202 B2 | 2/2010 | Wang et al. |
| 7,692,860 B2 | 4/2010 | Sato et al. |
| 7,704,806 B2 | 4/2010 | Chae |
| 7,713,779 B2 | 5/2010 | Firon |
| 7,719,678 B2 | 5/2010 | Kamins |
| 7,719,688 B2 | 5/2010 | Kamins |
| 7,732,769 B2 | 6/2010 | Snider |
| 7,732,839 B2 | 6/2010 | Sebe |
| 7,736,954 B2 | 6/2010 | Hussain |
| 7,740,824 B2 | 6/2010 | Godfried |
| 7,888,155 B2 | 2/2011 | Chen |
| 7,902,540 B2 | 3/2011 | Cohen |
| 7,948,555 B2 | 5/2011 | Kwon et al. |
| 8,030,729 B2 | 10/2011 | Quitoriano |
| 8,035,184 B1 | 10/2011 | Dutta et al. |
| 8,049,203 B2 | 11/2011 | Samuelson |
| 8,063,450 B2 | 11/2011 | Wernersson et al. |
| 8,067,299 B2 | 11/2011 | Samuelson |
| 8,067,736 B2 | 11/2011 | Gruss |
| 8,084,728 B2 | 12/2011 | Tsang |
| 8,093,675 B2 | 1/2012 | Tsunemi et al. |
| 8,118,170 B2 | 2/2012 | Sato |
| 8,143,658 B2 | 3/2012 | Samuelson |
| 8,154,127 B1 | 4/2012 | Kamins |
| 8,193,524 B2 | 6/2012 | Bjorek |
| 8,208,776 B2 | 6/2012 | Tokushima |
| 8,212,138 B2 | 7/2012 | Landis |

(56) References Cited

U.S. PATENT DOCUMENTS

| | | |
|---|---|---|
| 8,222,705 B2 | 7/2012 | Ogino |
| 8,242,353 B2 | 8/2012 | Karg |
| 8,269,985 B2 | 9/2012 | Wober |
| 8,274,039 B2 | 9/2012 | Wober |
| 8,299,472 B2 | 10/2012 | Yu et al. |
| 8,330,090 B2 | 12/2012 | Agarwal |
| 8,384,007 B2 | 2/2013 | Yu et al. |
| 8,455,857 B2 | 6/2013 | Samuelson |
| 8,471,190 B2 | 6/2013 | Wober |
| 8,514,411 B2 | 8/2013 | Wober |
| 8,546,742 B2 | 10/2013 | Wober |
| 8,748,799 B2 | 6/2014 | Wober |
| 8,766,272 B2 | 7/2014 | Yu et al. |
| 8,791,470 B2 | 7/2014 | Wober |
| 8,810,808 B2 | 8/2014 | Wober |
| 8,835,831 B2 | 9/2014 | Yu et al. |
| 8,866,065 B2 | 10/2014 | Wober |
| 9,000,353 B2 | 4/2015 | Seo |
| 2002/0003201 A1 | 1/2002 | Yu |
| 2002/0020846 A1 | 2/2002 | Pi et al. |
| 2002/0021879 A1 | 2/2002 | Lee |
| 2002/0071468 A1 | 6/2002 | Sandstrom |
| 2002/0104821 A1 | 8/2002 | Bazylenko |
| 2002/0109082 A1 | 8/2002 | Nakayama |
| 2002/0117675 A1 | 8/2002 | Mascarenhas |
| 2002/0130311 A1 | 9/2002 | Lieber |
| 2002/0172820 A1 | 11/2002 | Majumdar |
| 2003/0003300 A1 | 1/2003 | Korgel |
| 2003/0006363 A1 | 1/2003 | Campbell |
| 2003/0077907 A1 | 4/2003 | Kao et al. |
| 2003/0089899 A1 | 5/2003 | Lieber |
| 2003/0103744 A1 | 6/2003 | Koyama |
| 2003/0132480 A1 | 7/2003 | Chau |
| 2003/0160176 A1 | 8/2003 | Vispute |
| 2003/0189202 A1 | 10/2003 | Li |
| 2003/0227090 A1 | 12/2003 | Okabe |
| 2004/0011975 A1 | 1/2004 | Nicoli |
| 2004/0021062 A1 | 2/2004 | Zaidi |
| 2004/0026684 A1 | 2/2004 | Empedocles |
| 2004/0058058 A1 | 3/2004 | Shchegolikhin |
| 2004/0065362 A1 | 4/2004 | Watabe |
| 2004/0075464 A1 | 4/2004 | Samuelson |
| 2004/0095658 A1 | 5/2004 | Buretea |
| 2004/0109666 A1 | 6/2004 | Kim |
| 2004/0114847 A1 | 6/2004 | Fischer et al. |
| 2004/0118337 A1 | 6/2004 | Mizutani |
| 2004/0118377 A1 | 6/2004 | Bloms |
| 2004/0122328 A1 | 6/2004 | Wang |
| 2004/0124366 A1 | 7/2004 | Zeng |
| 2004/0155247 A1 | 8/2004 | Benthien |
| 2004/0156610 A1 | 8/2004 | Charlton et al. |
| 2004/0160522 A1 | 8/2004 | Fossum |
| 2004/0180461 A1 | 9/2004 | Yaung |
| 2004/0213307 A1 | 10/2004 | Lieber |
| 2004/0217086 A1 | 11/2004 | Kawashima |
| 2004/0223681 A1 | 11/2004 | Block |
| 2004/0241965 A1 | 12/2004 | Merritt |
| 2004/0252957 A1 | 12/2004 | Schmidt et al. |
| 2004/0261840 A1 | 12/2004 | Schmit |
| 2005/0009224 A1 | 1/2005 | Yang |
| 2005/0035381 A1 | 2/2005 | Holm |
| 2005/0082676 A1 | 4/2005 | Andry |
| 2005/0087601 A1 | 4/2005 | Gerst, III |
| 2005/0095699 A1 | 5/2005 | Miyauchi et al. |
| 2005/0109388 A1 | 5/2005 | Murakami |
| 2005/0116271 A1 | 6/2005 | Kato |
| 2005/0133476 A1 | 6/2005 | Islam |
| 2005/0161662 A1 | 7/2005 | Majumdar |
| 2005/0164514 A1 | 7/2005 | Rauf |
| 2005/0190453 A1 | 9/2005 | Dobashi |
| 2005/0201704 A1 | 9/2005 | Ellwood |
| 2005/0218468 A1 | 10/2005 | Owen |
| 2005/0224707 A1 | 10/2005 | Guedj |
| 2005/0242409 A1 | 11/2005 | Yang |
| 2005/0284517 A1 | 12/2005 | Shinohara |
| 2006/0011362 A1 | 1/2006 | Tao |
| 2006/0027071 A1 | 2/2006 | Barnett |
| 2006/0038990 A1* | 2/2006 | Habib et al. .................. 356/301 |
| 2006/0113622 A1 | 6/2006 | Adkisson |
| 2006/0115230 A1 | 6/2006 | Komoguchi et al. |
| 2006/0121371 A1 | 6/2006 | Wu |
| 2006/0146323 A1 | 7/2006 | Bratkovski |
| 2006/0162766 A1 | 7/2006 | Gee |
| 2006/0180197 A1 | 8/2006 | Gui |
| 2006/0208320 A1 | 9/2006 | Tsuchiya et al. |
| 2006/0257071 A1 | 11/2006 | Bise |
| 2006/0260674 A1 | 11/2006 | Tran |
| 2006/0273262 A1 | 12/2006 | Sayag |
| 2006/0273389 A1 | 12/2006 | Cohen |
| 2006/0284118 A1 | 12/2006 | Asmussen |
| 2007/0012980 A1* | 1/2007 | Duan et al. .................. 257/296 |
| 2007/0012985 A1 | 1/2007 | Stumbo |
| 2007/0023799 A1 | 2/2007 | Boettiger |
| 2007/0025504 A1 | 2/2007 | Tumer |
| 2007/0029545 A1 | 2/2007 | Striakhilev |
| 2007/0052050 A1 | 3/2007 | Dierickx |
| 2007/0076481 A1 | 4/2007 | Tennant |
| 2007/0082255 A1 | 4/2007 | Sun |
| 2007/0099292 A1 | 5/2007 | Miller |
| 2007/0104441 A1 | 5/2007 | Ahn et al. |
| 2007/0107773 A1 | 5/2007 | Fork |
| 2007/0108371 A1 | 5/2007 | Stevens |
| 2007/0114622 A1 | 5/2007 | Adkisson |
| 2007/0120254 A1 | 5/2007 | Hurkx et al. |
| 2007/0126037 A1 | 6/2007 | Ikeda |
| 2007/0137697 A1 | 6/2007 | Kempa |
| 2007/0138376 A1 | 6/2007 | Naughton |
| 2007/0138380 A1 | 6/2007 | Adkisson et al. |
| 2007/0138459 A1 | 6/2007 | Wong |
| 2007/0139740 A1 | 6/2007 | Igura |
| 2007/0140638 A1 | 6/2007 | Yang |
| 2007/0145512 A1 | 6/2007 | Rhodes |
| 2007/0148599 A1 | 6/2007 | True |
| 2007/0152248 A1 | 7/2007 | Choi |
| 2007/0155025 A1 | 7/2007 | Zhang |
| 2007/0164270 A1 | 7/2007 | Majumdar |
| 2007/0170418 A1 | 7/2007 | Bowers |
| 2007/0172623 A1 | 7/2007 | Kresse |
| 2007/0187787 A1 | 8/2007 | Ackerson |
| 2007/0196239 A1 | 8/2007 | Vink |
| 2007/0200054 A1 | 8/2007 | Reznik |
| 2007/0205483 A1 | 9/2007 | Williams |
| 2007/0217754 A1 | 9/2007 | Sasaki |
| 2007/0228421 A1 | 10/2007 | Shioya et al. |
| 2007/0238265 A1 | 10/2007 | Kurashina |
| 2007/0238285 A1 | 10/2007 | Borden |
| 2007/0241260 A1 | 10/2007 | Jaeger |
| 2007/0246689 A1 | 10/2007 | Ge |
| 2007/0248958 A1 | 10/2007 | Jovanovich |
| 2007/0272828 A1 | 11/2007 | Xu |
| 2007/0278500 A1 | 12/2007 | Lin |
| 2007/0285378 A1 | 12/2007 | Lankhorst |
| 2007/0290193 A1 | 12/2007 | Tucker |
| 2007/0290265 A1 | 12/2007 | Augusto |
| 2008/0001498 A1 | 1/2008 | Muller |
| 2008/0006319 A1 | 1/2008 | Bettge |
| 2008/0029701 A1 | 2/2008 | Onozawa |
| 2008/0036038 A1 | 2/2008 | Hersee |
| 2008/0044984 A1 | 2/2008 | Hsieh |
| 2008/0047601 A1 | 2/2008 | Nag |
| 2008/0047604 A1 | 2/2008 | Korevaar et al. |
| 2008/0055451 A1 | 3/2008 | Kanbe |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu et al. |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun |
| 2008/0137188 A1 | 6/2008 | Sato et al. |

(56) References Cited

U.S. PATENT DOCUMENTS

| | | |
|---|---|---|
| 2008/0143906 A1 | 6/2008 | Allemand et al. |
| 2008/0145965 A1 | 6/2008 | Reznik |
| 2008/0149914 A1 | 6/2008 | Samuelson et al. |
| 2008/0149944 A1 | 6/2008 | Samuelson |
| 2008/0157253 A1 | 7/2008 | Starikov |
| 2008/0166883 A1 | 7/2008 | Liu et al. |
| 2008/0169017 A1 | 7/2008 | Korevaar |
| 2008/0169019 A1 | 7/2008 | Korevaar |
| 2008/0173615 A1 | 7/2008 | Kim |
| 2008/0178924 A1 | 7/2008 | Kempa |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi |
| 2008/0246020 A1 | 10/2008 | Kawashima |
| 2008/0246123 A1 | 10/2008 | Kamins |
| 2008/0248304 A1 | 10/2008 | Hanrath |
| 2008/0251780 A1 | 10/2008 | Li |
| 2008/0258747 A1 | 10/2008 | Kluth |
| 2008/0260225 A1 | 10/2008 | Szu |
| 2008/0264478 A1 | 10/2008 | Ahn |
| 2008/0266556 A1 | 10/2008 | Kamins |
| 2008/0266572 A1 | 10/2008 | Kamins |
| 2008/0271783 A1 | 11/2008 | Murakami |
| 2008/0277646 A1 | 11/2008 | Kim |
| 2008/0283728 A1 | 11/2008 | Inoue |
| 2008/0283883 A1 | 11/2008 | Shim |
| 2008/0297281 A1 | 12/2008 | Ayazi |
| 2008/0311693 A1 | 12/2008 | Maxwell |
| 2008/0311712 A1 | 12/2008 | Anwat et al. |
| 2009/0001498 A1 | 1/2009 | Wang |
| 2009/0020150 A1 | 1/2009 | Atwater |
| 2009/0020687 A1 | 1/2009 | Lehmann et al. |
| 2009/0032687 A1 | 2/2009 | Lapstun |
| 2009/0046362 A1 | 2/2009 | Guo |
| 2009/0046749 A1 | 2/2009 | Mizuuchi |
| 2009/0050204 A1 | 2/2009 | Habib |
| 2009/0052029 A1 | 2/2009 | Dai et al. |
| 2009/0057650 A1 | 3/2009 | Lieber |
| 2009/0072145 A1 | 3/2009 | Peczalski |
| 2009/0104160 A1 | 4/2009 | Young |
| 2009/0120498 A1 | 5/2009 | Yamazaki |
| 2009/0121136 A1 | 5/2009 | Gruss |
| 2009/0127442 A1 | 5/2009 | Lee |
| 2009/0146198 A1 | 6/2009 | Joe |
| 2009/0151782 A1 | 6/2009 | Ko |
| 2009/0152664 A1 | 6/2009 | Klem |
| 2009/0153961 A1 | 6/2009 | Murakami et al. |
| 2009/0165844 A1 | 7/2009 | Dutta |
| 2009/0173976 A1 | 7/2009 | Augusto |
| 2009/0179225 A1 | 7/2009 | Fertig et al. |
| 2009/0179289 A1 | 7/2009 | Park |
| 2009/0188552 A1 | 7/2009 | Wang |
| 2009/0189144 A1 | 7/2009 | Quitoriano |
| 2009/0189145 A1 | 7/2009 | Want et al. |
| 2009/0194160 A1 | 8/2009 | Chin |
| 2009/0199597 A1 | 8/2009 | Danley |
| 2009/0201400 A1 | 8/2009 | Zhang et al. |
| 2009/0206405 A1 | 8/2009 | Doyle |
| 2009/0223558 A1 | 9/2009 | Sun |
| 2009/0224245 A1 | 9/2009 | Umezaki |
| 2009/0224349 A1 | 9/2009 | Gambino |
| 2009/0230039 A1 | 9/2009 | Hoenig et al. |
| 2009/0233445 A1 | 9/2009 | Lee |
| 2009/0242018 A1 | 10/2009 | Ahn |
| 2009/0243016 A1 | 10/2009 | Kawahara et al. |
| 2009/0244514 A1 | 10/2009 | Jin |
| 2009/0260687 A1 | 10/2009 | Park |
| 2009/0261438 A1 | 10/2009 | Choi |
| 2009/0266418 A1 | 10/2009 | Hu et al. |
| 2009/0266974 A1* | 10/2009 | Verhulst et al. ............ 250/208.1 |
| 2009/0272423 A1 | 11/2009 | Niira |
| 2009/0278998 A1 | 11/2009 | El-Ghoroury et al. |
| 2009/0289320 A1 | 11/2009 | Cohen |
| 2009/0305454 A1 | 12/2009 | Cohen |
| 2010/0006817 A1 | 1/2010 | Ohlsson et al. |
| 2010/0019252 A1 | 1/2010 | Bratkovski et al. |
| 2010/0019296 A1 | 1/2010 | Cha |
| 2010/0019355 A1 | 1/2010 | Kamins |
| 2010/0025710 A1 | 2/2010 | Yamada |
| 2010/0078055 A1 | 4/2010 | Vidu |
| 2010/0090341 A1 | 4/2010 | Wan |
| 2010/0101633 A1 | 4/2010 | Park |
| 2010/0104494 A1 | 4/2010 | Meng |
| 2010/0110433 A1 | 5/2010 | Nedelcu et al. |
| 2010/0116976 A1 | 5/2010 | Wober |
| 2010/0126573 A1 | 5/2010 | Youtsey |
| 2010/0127153 A1 | 5/2010 | Agarwal |
| 2010/0132779 A1 | 6/2010 | Hong |
| 2010/0133986 A1 | 6/2010 | Kim et al. |
| 2010/0136721 A1 | 6/2010 | Song |
| 2010/0148221 A1 | 6/2010 | Yu |
| 2010/0163714 A1 | 7/2010 | Wober |
| 2010/0163941 A1 | 7/2010 | Jung |
| 2010/0178018 A1 | 7/2010 | Augusto |
| 2010/0186809 A1 | 7/2010 | Samuelson et al. |
| 2010/0187404 A1 | 7/2010 | Klem |
| 2010/0200065 A1 | 8/2010 | Choi |
| 2010/0207103 A1 | 8/2010 | Farrow |
| 2010/0218816 A1 | 9/2010 | Guha |
| 2010/0229939 A1 | 9/2010 | Shen |
| 2010/0230653 A1 | 9/2010 | Chen |
| 2010/0237454 A1 | 9/2010 | Fujisawa |
| 2010/0244108 A1 | 9/2010 | Kohnke et al. |
| 2010/0244169 A1 | 9/2010 | Maeda et al. |
| 2010/0249877 A1 | 9/2010 | Naughton |
| 2010/0258184 A1 | 10/2010 | Laughlin |
| 2010/0276572 A1 | 11/2010 | Iwabuchi |
| 2010/0277607 A1 | 11/2010 | Choi |
| 2010/0282314 A1 | 11/2010 | Coakley |
| 2010/0295019 A1 | 11/2010 | Wang et al. |
| 2010/0302440 A1 | 12/2010 | Wober |
| 2010/0304061 A1 | 12/2010 | Ye et al. |
| 2010/0308214 A1 | 12/2010 | Wober |
| 2010/0313952 A1 | 12/2010 | Coakley |
| 2010/0319763 A1 | 12/2010 | Park |
| 2010/0320444 A1 | 12/2010 | Dutta |
| 2011/0018424 A1 | 1/2011 | Takada |
| 2011/0036396 A1 | 2/2011 | Jayaraman |
| 2011/0037133 A1 | 2/2011 | Su et al. |
| 2011/0049572 A1 | 3/2011 | Jeon et al. |
| 2011/0050042 A1 | 3/2011 | Choi et al. |
| 2011/0057231 A1 | 3/2011 | Jeon et al. |
| 2011/0057234 A1 | 3/2011 | Jeon et al. |
| 2011/0057286 A1 | 3/2011 | Jeon et al. |
| 2011/0080508 A1 | 4/2011 | Katsuno et al. |
| 2011/0084212 A1 | 4/2011 | Clark |
| 2011/0127490 A1 | 6/2011 | Mi |
| 2011/0133060 A1 | 6/2011 | Yu et al. |
| 2011/0133160 A1 | 6/2011 | Yu et al. |
| 2011/0135814 A1 | 6/2011 | Miyauchi et al. |
| 2011/0139176 A1 | 6/2011 | Cheung et al. |
| 2011/0146771 A1 | 6/2011 | Chuang et al. |
| 2011/0147870 A1 | 6/2011 | Ang et al. |
| 2011/0180894 A1 | 7/2011 | Samuelson |
| 2011/0195577 A1 | 8/2011 | Kushibiki et al. |
| 2011/0220191 A1 | 9/2011 | Flood |
| 2011/0226937 A1 | 9/2011 | Yu et al. |
| 2011/0248315 A1 | 10/2011 | Nam |
| 2011/0249219 A1 | 10/2011 | Evans |
| 2011/0249322 A1 | 10/2011 | Wang |
| 2011/0253982 A1 | 10/2011 | Wang et al. |
| 2011/0272014 A1 | 11/2011 | Mathai et al. |
| 2011/0297214 A1 | 12/2011 | Kim |
| 2011/0309237 A1 | 12/2011 | Seo et al. |
| 2011/0309240 A1 | 12/2011 | Yu |
| 2011/0309331 A1 | 12/2011 | Yu |
| 2011/0315988 A1 | 12/2011 | Yu et al. |
| 2011/0316106 A1 | 12/2011 | Kim |

(56) References Cited

U.S. PATENT DOCUMENTS

| | | | |
|---|---|---|---|
| 2012/0006390 A1 | 1/2012 | Huo et al. |
| 2012/0009714 A1 | 1/2012 | Mouli |
| 2012/0014837 A1 | 1/2012 | Fehr et al. |
| 2012/0029328 A1 | 2/2012 | Shimizu |
| 2012/0031454 A1 | 2/2012 | Fogel |
| 2012/0060905 A1 | 3/2012 | Fogel |
| 2012/0075513 A1 | 3/2012 | Chipman et al. |
| 2012/0153124 A1 | 6/2012 | Yu |
| 2012/0192939 A1 | 8/2012 | Tamboli et al. |
| 2012/0196383 A1 | 8/2012 | Nitkowski et al. |
| 2012/0196401 A1 | 8/2012 | Graham |
| 2012/0240999 A1 | 9/2012 | Yoshida |
| 2012/0258563 A1 | 10/2012 | Ogino |
| 2012/0280345 A1 | 11/2012 | Zhu |
| 2012/0298843 A1 | 11/2012 | Yu |
| 2012/0313078 A1 | 12/2012 | Fukui |
| 2012/0318336 A1 | 12/2012 | Hekmatshoar-Tabari et al. |
| 2012/0322164 A1 | 12/2012 | Lal |
| 2013/0000704 A1 | 1/2013 | Fogel |
| 2013/0020620 A1 | 1/2013 | Wober |
| 2013/0037100 A1 | 2/2013 | PlatzerBjorkman |
| 2013/0112256 A1 | 5/2013 | Yu |
| 2013/0125965 A1 | 5/2013 | Hazeghi et al. |
| 2013/0174904 A1 | 7/2013 | Yamasaki |
| 2013/0220406 A1 | 8/2013 | Day |
| 2013/0341749 A1 | 12/2013 | Yu et al. |
| 2014/0045209 A1 | 2/2014 | Chou |
| 2014/0096816 A1 | 4/2014 | Atwater et al. |
| 2014/0117401 A1 | 5/2014 | Herner |

FOREIGN PATENT DOCUMENTS

| | | |
|---|---|---|
| CN | 100350429 | 11/2007 |
| CN | 101459185 | 6/2009 |
| CN | 100568516 | 12/2009 |
| CN | 101675522 | 3/2010 |
| CN | 101681941 | 3/2010 |
| CN | 103201858 | 7/2013 |
| EP | 0809303 B1 | 9/2006 |
| FR | 2923651 | 5/2009 |
| GB | 2348399 A | 4/2000 |
| JP | 359013708 A | 1/1981 |
| JP | 59198413708 | 1/1984 |
| JP | 2000324396 | 11/2000 |
| JP | 2002151715 | 5/2002 |
| JP | 2005252210 | 9/2005 |
| JP | 2005328135 | 11/2005 |
| JP | 2007134562 | 5/2007 |
| JP | 2007152548 | 6/2007 |
| JP | 2007184566 | 7/2007 |
| JP | 2007520877 | 7/2007 |
| JP | 2007201091 | 8/2007 |
| JP | 2007317961 | 12/2007 |
| JP | 2008288585 | 11/2008 |
| JP | 2009506546 | 2/2009 |
| JP | 2009236914 | 10/2009 |
| JP | 2012/543250 | 4/2013 |
| JP | 2013513253 | 4/2013 |
| JP | 2013513254 | 4/2013 |
| TW | I318418 | 5/2004 |
| TW | I228782 | 3/2005 |
| TW | 200535914 | 11/2005 |
| TW | 200536048 | 11/2005 |
| TW | 200742115 | 4/2007 |
| TW | 200810100 | 2/2008 |
| TW | 200814308 | 3/2008 |
| TW | 200845402 | 11/2008 |
| TW | 200847412 | 12/2008 |
| TW | 200915551 | 4/2009 |
| TW | 200941716 | 10/2009 |
| TW | 201027730 | 7/2010 |
| TW | 201034172 | 9/2010 |
| TW | 201044610 | 12/2010 |
| TW | 201140859 | 11/2011 |
| WO | 8603347 | 6/1986 |
| WO | 0002379 | 1/2000 |
| WO | 02069623 | 9/2002 |
| WO | 03107439 A1 | 12/2003 |
| WO | 2005064337 | 7/2005 |
| WO | 2007/000879 | 1/2007 |
| WO | 2008069565 | 6/2008 |
| WO | 2008079076 | 7/2008 |
| WO | 2008131313 | 10/2008 |
| WO | 2008135905 | 11/2008 |
| WO | 2008135905 A3 | 11/2008 |
| WO | 2008143727 | 11/2008 |
| WO | 2008131313 | 12/2008 |
| WO | 2009099841 | 8/2009 |
| WO | 2009116018 | 9/2009 |
| WO | 2009137241 | 11/2009 |
| WO | 2010019887 | 2/2010 |
| WO | 2010039631 | 4/2010 |
| WO | 2011074457 | 6/2011 |

OTHER PUBLICATIONS

University of California San Diego, Class ECE 183 Lab 1 2013.*
University of California San Diego, Class ECE 183 Lab 1 2013, "UCSD", hereinafter.*
Baomin Wang and Paul W. Leu, Nanotechology 23 (2012) 194003, 7 pages.
Sangmoo Jeon, et al., Nano Lett. 2012, 12, 2971-2976.
Sangmoo Jeong et al., J. Vac. Sci. Technol. A 30(6), Nov./Dec. 2012.
Sarkar et. al., Integrated polarization-analyzing CMOS image sensor for detecting incoming light ray direction, Sensors Application Symposium (SAS), Mar. 29, 2012, p. 194-199, 1010 IEEE.
Jin-Kon Kim; 'New Functional Nanomaterials Based on Block Copolymers' http://www.ziu.edu.cn/adver/subjectizyhd/jz0707061313.html, Jul. 7, 2011.
Ozgur Yavuzcetin, et al.; 'Index-tuned Anti-reflective Coating using a Nanostructured Metamaterial'; http://www.umass.edu/research/rld/bioportal/vuewtech.php?tid=40, Feb. 28, 2007.
Reynard Corporation; 'Anti-Reflection Coatings (AR)', http://www.reynardcorp.com/coating_anti_reflection.php, undated.
Shimizu et al., Homoepitaxial Growth of Vertical Si Nanowires on Si(100) Substrate using Anodic Aluminum Oxide Template, (abstract only), Materials Research Society, Fall 2007.
Wang, Introduction to Nanotechnology—Where Opportunities arise & Great Future Being Built from Small Things, Fall 2008.
International Preliminary Report and Written Opinion re PCT/US2010/059491, mailed Jun. 21, 2012.
International Search Report and Written Opinion re PCT/US2011/57325, mailed Jun. 22, 2012.
International Preliminary Report and Written Opinion re PCT/US2010/059468, mailed Jun. 21, 2012.
International Preliminary Report and Written Opinion re PCT/US2010/059504, mailed Jun. 21, 2012.
International Preliminary Report and Written Opinion re PCT/US2010/059496, mailed Jun. 21, 2012.
U.S. Office Action for U.S. Appl. No. 12/573,582, dated Jun. 28, 2012.
William Shockley and H. Queisser, Detailed Balance Limit of Efficiency of p-n Junction Solar Cells, J. of Appl. Physics, 1961, March 32(3).
International Preliminary Report on Patentability for PCT International Application No. PCT/US2010/035722, mailed Nov. 3, 2011.
International Search Report and Written Opinion for PCT International Patent Application No. PCT/US2011/060348, mailed Mar. 9, 2012.
International Search Report and Written Opinion for PCT International Patent Application No. PCT/US2011/064635, mailed Apr. 13, 2012.
International Search Report and Written Opinion for PCT International Patent Application No. PCT/US2011/066097, mailed Mar. 12, 2012.
International Search Report and Written Opinion for PCT International Patent Application No. PCT/US2011/067712, mailed May 3, 2012.

(56) References Cited

OTHER PUBLICATIONS

U.S. Office Action for U.S. Appl. No. 13/494,661, notification date Nov. 7, 2012.
CMOS image sensor pixel microlens array optimization using FDTD Solutions, http://www.lumerical_com/ fdtd_microlens/cmos_image_sensor_pixel_microlens.php, pp. 1-2, Jun. 25, 2008.
"CMOS image sensor pixel optical efficiency and optical crosstalk optimization using FDTD Solutions" www.lumerical.com/fdtd_microlens/cmos_image_sensor_pixel_microlens.php, Mar. 19, 2009.
Adler, Nanowire Lawns Make for Sheets of Image Sensors, NewScientist.com, Jul. 28, 2008.
Babinec et al., High-Flux, Low-Power Diamond Nanowire Single-Photon Source Arrays: An Enabling Material for Optical and Quantum Computing and Cryptography, obtained on Jul. 22, 2010 at URL: <http://otd.harvard.edu/technologies/tech.php?case=3702>.
Baillie et al., 'Zero-space microlenses for CMOS image sensors: optical modeling and lithographic process development', Publication Date May 2004, http://adsabs.harvard.edu/abs/2004SPIE.5377.. 953B, pp. 1-2.vbTab.
Barclay et al., Chip-Based Microcavities Coupled to NV Centers in Single Crystal Diamond, Applied Physics Letters, Nov. 12, 2009, vol. 95, Issue 19.
Brouri et al., Photon Antibunching in the Flurescence of Individual Colored Centers in Diamond, Optics Letters, Sep. 1, 2000, vol. 25, Issue 17.
Chung, Sung-Wook et al. Silicon Nanowire Devices. Applied Physics Letters, vol. 76, No. 15 (Apr. 10, 2000), pp. 2068-2070.
Deptuch et al., Vertically Integrated Circuits at Fermilab, IEEE Transactions on Nuclear Science, Aug. 2010, vol. 54, Issue 4, pp. 2178-2186.
Ekroll, On the Nature of Simultaneous Color Contrast, Dissertation, University of Kiel, 2005.
Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.
Fang et al., Fabrication of Slantingly-Aligned Silicon Nanowire Arrays for Solar Cell Applications, Nanotechnology, 2008, vol. 19, No. 25.
Furumiya, et al. "High-sensitivity and no-crosstalk pixel technology for embedded CMOS image sensor"; IEEE Electron Device Letters, vol. 48, No. 10, Oct. 2001.
Gadelrab et al., The Source-Gated Amorphous Silicon Photo-Transistor, IEEE Transactions on Electron Devices, Oct. 1997, vol. 44, No. 10, pp. 1789-1794.
Gambino et al., 'CMOS Imager with Copper Wiring and Lightpipe,' Electron Devices Meeting, 2006. IEDM '06, International Publication Date: Dec. 11-13, 2006, pp. 1-4.
Garnett et al., Light Trapping in Silicon Nanowire Solar Cells, Nanoletters, Jan. 28, 2010, vol. 10, No. 3, pp. 1082-1087.
Ge et al., Orientation-Controlled Growth of Single-Crystal Silicon-Nanowire Arrays, Advanced Materials, Jan. 18, 2005, vol. 17, No. 1, pp. 56-61.
Guillaumée, et al., Polarization Sensitive Silicon Photodiodes Using Nanostructured Metallic Grids, Applied Physics Letters 94, 2009.
Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.
Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.
Hochbaum et al., Controlled Growth of Si Nanowire Arrays for Device Integration, Nano Letters, Mar. 2005, vol. 5, No. 3, pp. 457-460.
Holmes et al., Control of Thickness and Orientation of Solution-Grown Silicon Nanowires, Science, Feb. 25, 2000, vol. 287, No. 5457, pp. 1471-1473.

International Preliminary Report on Patentability for PCT International Patent Application No. PCT/U62009/055963, mailed Mar. 17, 2011.
International Search Report and Written Opinion for PCT International Application No. PCT/US2010/035722, mailed Jul. 20, 2010.
International Search Report and Written Opinion for PCT International Application No. PCT/US2010/035726, mailed Jul. 21, 2010.
International Search Report and Written Opinion for PCT International Application No. PCT/US2010/057227, mailed Jan. 26, 2011.
International Search Report and Written Opinion for PCT International Patent Application No. PCT/US2009/055963, mailed Oct. 15, 2009.vbTab.
International Search Report and Written Opinion for PCT International Patent Application No. PCT/US2009/063592, mailed Jan. 13, 2010.
International Search Report and Written Opinion for PCT International Patent Application No. PCT/US2010/035727, mailed Sep. 27, 2010.
International Search Report and Written Opinion for PCT International Patent Application No. PCT/US2010/051435, mailed Dec. 3, 2010.
International Search Report and Written Opinion for PCT International Patent Application No. PCT/US2010/051446, mailed Jan. 3, 2011.
International Search Report and Written Opinion for PCT International Patent Application No. PCT/US2010/059468, mailed Feb. 11, 2011.
International Search Report and Written Opinion for PCT International Patent Application No. PCT/US2010/059491, mailed Feb. 9, 2011.
International Search Report and Written Opinion for PCT International Patent Application No. PCT/US2010/059501, mailed Feb. 15, 2011.
International Search Report and Written Opinion for PCT International Patent Application No. PCT/US2010/059504, mailed Apr. 7, 2011.
Jin-Kon Kim; 'New Functional Nanomaterials Based on Block Copolymers' http://www.ziu.edu.cn/adver/subjectizyhd/jz0707061313.html.
Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1, pp. 422-426.
Junger, et. al., Polarization- and wavelength-sensitive sub-wavelength structures fabricated in the metal layers of deep submicron CMOS processes, Proc. of SPIE, vol. 7712, 2010.
Kalkofen et al., Atomic Layer Deposition of Boron Oxide as Dopant Source for Shallow Doping of Silicon, Meeting Abstract 943, 217th ECS Meeting, MA2010-01 , Apr. 25-30, 2010, Vancouver Canada, EI—Advanced Gate Stack, Source / Drain, and Channel Engineering for Si-Based CMOS 6: New Materials, Processes, and Equipment.
Kane, Why Nanowires Make Great Photodetectors, EurekAlert.com article, Apr. 25, 2007.
Kempa, Thomas J. et al. Single and Tandem Axial p-i-n Nanowire Photovoltaic Devices. Nano Letters. 2008, vol. 8, No. 10, 3456-3460.
Kim et al., Electronic Structure of Vertically Aligned Mn-Doped CoFe2O4 Nanowires and Their Application as Humidity Sensors and Photodetectors, Journal of Physical Chemistry C, Apr. 7, 2009.
Law, et al., 'Semiconductor Nanowires and Nanotubes'; Annu. Rev. Mater. Res. 2004, 34:83-122.
Lee et al., Vertical Pillar-Superlattice Array and Graphene Hybrid Light Emitting Diodes, Nano Letters, 2010, vol. 10, pp. 2783-2788.
Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.
Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.
Loncar et al., Diamond Nanotechnology, SPIE Newsroom, May 18, 2010, obtained at url: <http://spie.org/x40194.xml?ArticleID=x40194>.

(56) References Cited

OTHER PUBLICATIONS

Loose et al., CMOS Detector Technology, Scientific Detector Workshop, Sicily, 2005, Experimental Astronomy, vol. 19, Issue 1-3, pp. 111-134.
Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.
Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.
Madou, Properties and Growth of Silicon, Including Crystalline Silicon, Fundamentals of Microfabrication, 2nd Ed., CRC Press, 2002, pp. 125-204.
Makarova et al., Fabrication of High Density, High-Aspect-Ratio Polyimide Nanofilters, Journal of Vacuum Science and Technology, Nov./Dec. 2009, vol. 27, No. 6., pp. 2585-2587.
Morales et al., A Laser Ablation Method for the Synthesis of Crystalline Semiconductor Nanowires, Science, Jan. 9, 1998, vol. 279, pp. 208-211.
N. L. Dmitruk, et al.; 'Modeling and Measurement of Optical Response of 1D Array of Metallic Nanowires for Sensing and Detection Application'; 26th International Conference on Microelectronics (MIEL 2008), Nis, Serbia, May 11-14, 2008.
Nguyen et al., Deep Reactive Ion etching of Polyimide for Microfluidic Applications, Journal of the Korean Physical Society, Sep. 2007, vol. 51, No. 3, pp. 984-988.
Ozgur Yavuzcetin, et al.; 'Index-tuned Anti-reflective Coating using a Nanostructured Metamaterial'; http://www.umass.edu/research/rld/bioportal/vuewtech.php?tid=40.
Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.
Parraga et al., Color and Luminance Information in Natural Scenes, Journal of Optical Society of America A, Optics, Image, Science and Vision, Jun. 1998, vol. 15, No. 6.
Reynard Corporation; 'Anti-Reflection Coatings (AR)', http://www.reynardcorp.com/coating_anti_reflection.php.
Rosfjord et al., Nanowire Single-Photon Detector with an Integrated Optical Cavity and Anti-Reflection Coating, Optics Express: The International Electronic Journal of Optics, Jan. 23, 2006, vol. 14, No. 2, pp. 527-534.
Rugani, First All-Nanowire Sensor, Technology Review, Aug. 13, 2008, Published by MIT.
Rutter, Diamond-Based Nanowire Devices Advance Quantum Science, SEAS Communications, Feb. 14, 2010, obtained at url:<http://news.harvard.edu/gazette/story/2010/02/digging-deep-into-diamonds/>.
Sarkar et. al., Integrated polarization-analyzing CMOS image sensor for detecting incoming light ray direction, Sensors Application Symposium (SAS) p. 194-199, 1010 IEEE.
Schmidt et al., Realization of a Silicon Nanowire Vertical Surround-Gate Field-Effect Effect Transistor, Small, Jan. 2006, vol. 2, No. 1, pp. 85-88.
Shimizu et al., Homoepitaxial Growth of Vertical Si Nanowires on Si(100) Substrate using Anodic Aluminum Oxide Template, (abstract only), Materials Research Society.
Song et al., Vertically Standing Ge Nanowires on GaAs(110) Substrates, Nanotechnology 19, Feb. 21, 2008.
T. H. Hsu, et al. 'Light Guide for Pixel Crosstalk Improvement in Deep Submicron CMOS Image Sensor'; IEEE Electron Device Letters, vol. 25, No. 1, Jan. 2004.
Thelander et al., Nanowire-Based One-Dimensional Electronics, Materials Today, Oct. 2006, vol. 9, No. 10, pp. 28-35.
Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.
Tseng, et al. 'Crosstalk improvement technology applicable to 0.14μm CMOS image sensor'; IEEE International Electron Devices Meeting, Dec. 13-15, 2004; IEDM Technical Digest, pp. 997-1000. vbTab.
Verheijen, Marcel A. et al. Growth Kinetics of Heterostructured GaP-GaAs Nanowires. J. Am. Chem. Soc. 2006, 128, 1353-1359.
Wagner, R.S. and Ellis, W.C. Vapor-Liquid-Solid Mechanism of Single Crystal Growth. Applied Physics Letters. vol. 4, No. 5 (Mar. 1, 1964), pp. 89-90.
Wang, Introduction to Nanotechnology—Where Opportunities arise & Great Future Being Built from Small Things.
Wong et al., Lateral Nanoconcentrator Nanowire Multijunction Photovoltaic Cells, GCEP Progress report, Apr. 20, 2009, pp. 1-18.
Ye et al., Fabrication Techniques of High Aspect Ratio Vertical Lightpipes Using a Dielectric Photo Mask, SPIE, Proceedings, Feb. 2010, vol. 7591.
Zhang et al., Ultrahigh Responsivity Visible and Infrared Detection Using Silicon Nanowire Phototransistors, Nanoletters, May 14, 2010, vol. 10, No. 6, pp. 2117-2120.
U.S. Office Action for U.S. Appl. No. 13/048,635, mailed Jun. 6, 2013, 24 pages.
U.S. Office Action for U.S. Appl. No. 12/966,535, mailed Jun. 14, 2013, 22 pages.
Taiwanese Office Action of Taiwan Patent Application No. 099116881, issued Jul. 18, 2013 (8 pages).
Canadian Office Action of Canadian Application No. 3,676,376, dated Oct. 11, 2013.
Catrysse, et al., An Integrated Color Pixel in 0.18pm CMOS Technology, Proceedings IEDM 2001, pp. 559-562.
Choi et al., Optimization of sidewall roughness in silica waveguides to reduce propagation losses, May 2001, Lasers and Electro-Optics, 2001. CLEO '01. Technical Digest. Summaries of papers presented at the Conference on, pp. 175-176.
Geyer et al., Model for the Mass Transport during Metal-Assisted Chemical Etching with Contiguous Metal Films as Catalysts, J. Phys. Chem. C 2012, 116, 13446-13451.
Hopkins, Addressing sidewall roughness using dry etching silicon and Si02, Jul. 1, 2004, ElectroIQ, vol. 47, Issue 7.
Mei-Ling Kuo et al. "Realization of a near-perfect antireflection coating for silicon solar energy utilization" (Nov. 1, 2008, vol. 33, No. 21, Optics Letters).
Mukhopadhyay, When PDMS Isn't the Best, American Chemical Society, May 1, 2007.
Seo, et. al., "Multicolored vertical silicon nanowires," Nano Letters, vol. 11 issue 4, pp. 1851-1856, 2010.
U.S. Final Office Action for U.S. Appl. No. 12/966,514, mailed Mar. 19, 2013, 50 pages.
U.S. Final Office Action for U.S. Appl. No. 13/494,661, mailed Mar. 7, 2013, 10 pages.
U.S. Office Action for U.S. Appl. No. 12/633,313, dated Aug. 1, 2013, 20 pages.
U.S. Office Action for U.S. Appl. No. 12/966,514, dated Aug. 15, 2013, 17 pages.
U.S. Office Action for U.S. Appl. No. 12/966,573, dated Aug. 6, 2013, 13 pages.
U.S. Office Action for U.S. Appl. No. 12/982,269 mailed Jun. 11, 2014.
U.S. Office Action for U.S. Appl. No. 13/106,851 mailed May 29, 2014.
U.S. Office Action for U.S. Appl. No. 13/556,041 mailed Jun. 12, 2014.
Office Action issued on Jun. 19, 2014 in Taiwanese Application No. 099133891.
Office Action issued on Jan. 28, 2014 in Taiwanese Application No. 100146327.
U.S. Office Action for U.S. Appl. No. 12/966,514, mailed Feb. 25, 2014.
U.S. Office Action for U.S. Appl. No. 12/945,492 mailed May 13, 2014.
U.S. Office Action for U.S. Appl. No. 12/633,313 mailed Aug. 1, 2014.
U.S. Office Action for U.S. Appl. No. 13/693,207 mailed Oct. 9, 2014.

(56) References Cited

OTHER PUBLICATIONS

Office Action issued on Oct. 29, 2014 in Korean Application No. 10-2013-7020107.
U.S. Office Action for U.S. Appl. No. 13/925,429 mailed Nov. 4, 2014.
Corrected Notice of Allowability issued on Oct. 14, 2014 in U.S. Appl. No. 12/966,535.
U.S. Office Action for U.S. Appl. No. 14/274,448 mailed Dec. 5, 2014.
U.S. Office Action for U.S. Appl. No. 13/543,307 mailed Dec. 24, 2014.
International Search Report and Written Opinion for International Application No. PCT/US2014/056558 mailed Dec. 12, 2014.
Office Action issued on Nov. 11, 2014 in Taiwanese Application No. 098129911.
Notice of Allowance issued on Dec. 1, 2014 in U.S. Appl. No. 12/910,664.
International Search Report and Written Opinion for International Application No. PCT/US2014/050544 mailed Jan. 9, 2015.
Kosonocky, et al., 160 × 244 Element PtSi Schottky-Barrier IR-CCD Image Sensor, IEEE Transactions on Electron Devices, vol. Ed-32, No. 8, Aug. 1985.
Office Action issued on Mar. 18, 2015 in Chinese Application No. 201180066970.6.
Office Action issued Apr. 3, 2015 in Chinese Application No. 201180051048.
Office Action issued May 15, 2015 in U.S. Appl. No. 14/274,448.
Office Action for U.S. Appl. No. 12/982,269 mailed May 22, 2015.
Office Action issued May 22, 2015 in Taiwanese Application No. 099142971.
Office Action mailed May 26, 2015 in Japanese Application No. 2014 138265.
Office Action for U.S. Appl. No. 14/068,864 mailed Jun. 15, 2015.
Office Action issued on May 5, 2015 in Chinese Application No. 201410264248.9.
Office Action for U.S. Appl. No. 14/450,812 mailed Jul. 23, 2015.
Office Action for U.S. Appl. No. 14/293,164 mailed Aug. 14, 2015.
Office Action issued Aug. 12, 2015 in Chinese Application No. 201180054442.9.
Office Action mailed Sep. 30, 2015 in Japanese Application No. 2014-094365.
Office Action for U.S. Appl. No. 12/633,313 mailed Oct. 21, 2015.
Office Action for U.S. Appl. No. 13/963,847 mailed Sep. 1, 2015.
Office Action for U.S. Appl. No. 12/945,492 mailed Sep. 9, 2015.
Office Action for U.S. Appl. No. 14/459,398 mailed Sep. 16, 2015.
Office Action for U.S. Appl. No. 14/274,448 mailed Aug. 26, 2015.
Office Action for U.S. Appl. No. 13/288,131 mailed Oct. 22, 2015.
Office Action for U.S. Appl. No. 14/450,815 mailed Oct. 28, 2015.
Office Action for U.S. Appl. No. 12/945,429 mailed Sep. 4, 2015.
Office Action dated Oct. 6, 2015 in Taiwanese Application No. 100141376.
Office Action dated Sep. 11, 2015 in Taiwanese Application No. 103143553.
International Search Report and Written Opinion mailed Nov. 27, 2015 in International Application No. PCT/US2015/038999.
Office Action issued on Nov. 25, 2015 in Japanese Application No. 2015-005091.
Office Action issued Nov. 17, 2015 in Taiwanese Application 103102171.
Office Action issued Nov. 20, 2015 in Taiwanese Application 104108370.
Office Action issued on Nov. 27, 2015 in Taiwanese Application No. 100138526.
International Search Report and Written Opinion mailed Jan. 8, 2016 in International Application No. PCT/US2015/055728.
Office Action issued Jan. 4, 2016 in U.S. Appl. No. 14/311,954.
Office Action issued Jan. 5, 2016 in U.S. Appl. No. 14/291,888.
Office Action issued Nov. 9, 2015 in U.S. Appl. No. 14/503,598.
Office Action issued Jan. 15, 2016 in U.S. Appl. No. 14/632,739.
Office Action issued Jan. 4, 2016 in U.S. Appl. No. 14/293,164.
Office Action issued Jan. 7, 2016 in U.S. Appl. No. 14/322,503.
Office Action issued Jan. 14, 2016 in U.S. Appl. No. 14/459,398.
Office Action for U.S. Appl. No. 14/450,812 mailed Oct. 28, 2015.
International Preliminary Search Report on Patentability of PCT/US201-057325, mailed May 2, 2013.
Office Action issued Dec. 28, 2015 in Taiwanese Application No. 102149110.
Office Action issued Dec. 25, 2015 in Chinese Application No. 201410264248.9.
Office Action issued Dec. 30, 2015 in Taiwanese Application No. 104123757.
International Search Report and Written Opinion mailed Nov. 27, 2015 in International Application PCT/US2015/038999.
International Preliminary Report on Patentability issued Feb. 9, 2016 in International Application PCT/US2014/050544.
International Search Report and Written Opinion mailed Feb. 9, 2016 in International Application PCT/US2015/55710.
Office Action issued Jan. 15, 2016 in Chinese Application No. 201180066970.6.
Office Action for U.S. Appl. No. 13/693,207 mailed May 7, 2015.
Kim, Y.S. et al., "ITO/AU/ITO multilayer thin films for transparent conducting electrode applications", Applied Surface Science, vol. 254 (2007), pp. 1524-1527.
Philipp, H.R. et al., "Optical Constants of Silicon in the Region 1 to 10 ev", Physical Review, vol. 120, No. 1, pp. 37-38.
Office Action for U.S. Appl. No. 13/543,307 mailed Apr. 17, 2015.
Office Action issued Mar. 19, 2015 in Chinese Application No. 201180065814.8.
Office Action for U.S. Appl. No. 13/288,131 mailed Apr. 17, 2015.
Office Action for U.S. Appl. No. 14/281,108 mailed Apr. 6, 2015.
Office Action for U.S. Appl. No. 14/450,812 mailed Apr. 1, 2015.
Office Action for U.S. Appl. No. 12/633,313 mailed Apr. 9, 2015.
Office Action for U.S. Appl. No. 12/982,269, mailed Jan. 15, 2015.
Notice of Allowance issued Jan. 30, 2015 in U.S. Appl. No. 14/487,375.
Office Action for U.S. Appl. No. 12/945,492 mailed Jan. 16, 2015.
Office Action for U.S. Appl. No. 13/963,847 mailed Mar. 12, 2015.
Office Action issued on Jan. 16, 2015 in Chinese Application No. 201180054442.9.
Bernstein et al. "Modern Physics", Chapter 14, Section 6, pp. 420-421, 2000 by Prentice-Hall Inc.
Office Action issued Feb. 23, 2015 in U.S. Appl. No. 13/925,429.
Office Action issued on Mar. 4, 2015 in U.S. Appl. No. 13/556,041.
Office Action issued Jul. 9, 2015 in Taiwanese Application No. 102124069.
A. Gu et al., "Design and growth of III—V nanowire solar cell arrays on low cost substrates," Conf. Record, 35rd IEEE Photovoltaic Specialists Conference, Honolulu, Jun. 2010, pp. 20-25.
Office Action issued Jun. 23, 2015 in Chinese Application No. 201310284409.6.
Office Action issued Feb. 4, 2016 in U.S. Appl. No. 14/274,448.
Office Action issued Mar. 7, 2016 in U.S. Appl. 14/450,812.
Office Action issued Feb. 25, 2016 in Chinese Application No. 201180051048.X.
Office Action issued Feb. 1, 2016 in Taiwanese Application 102124069.
Office Action issued Feb. 6, 2016 in Chinese Application No. 201180054442.9.
Office Action mailed Mar. 29, 2016 in Japanese Application No. 2014-138265.
International Preliminary Report on Patentability issued on Mar. 22, 2016 in International Application PCT/US2014/056558.
Decision issued on Jan. 30, 2016 in Taiwanese Application 099142971.
Office Action issued Apr. 21, 2016 in U.S. Appl. 14/322,503.
Office Action issued Apr. 14, 2016 in U.S. Appl. 14/704,143.
Office Action issued Apr. 27, 2016 in U.S. Appl. No. 14/291,888.

* cited by examiner

METHODS FOR FABRICATING AND USING NANOWIRES

DOMESTIC PRIORITY INFORMATION

This application claims the benefit of U.S. Provisional Application No. 61/357,429, filed on Jun. 22, 2010, which is hereby incorporated by reference as if fully set forth herein.

CROSS-REFERENCE TO RELATED APPLICATIONS

This application is related to U.S. patent application Ser. No. 12/204,686 (granted as U.S. Pat. No. 7,646,943), Ser. Nos. 12/648,942, 12/270,233, 12/472,264, 12/472,271, 12/478,598, 12/573,582, 12/575,221, 12/633,323, 12/633,318, 12/633,313, 12/633,305, 12/621,497, 12/633,297, 61/266,064, 61/357,429, 61/306,421, 61/306,421, 12/910,664 and 12/910,664, the disclosures of which are hereby incorporated by reference in their entirety.

FIELD

This application generally relates to semiconductor sensing devices and manufacturing, and in particular, selected spectral absorption of nanowires.

BACKGROUND

An image sensor may be fabricated to have a large number of identical sensor elements (pixels), generally more than 1 million, in a (Cartesian) square grid. The pixels may be photodiodes, or other photosensitive elements, that are adapted to convert electromagnetic radiation into electrical signals. Recent advances in semiconductor technologies have enabled the fabrication of nanoscale semiconductor components such as nanowires.

Nanowires have been introduced into solid state image devices to confine and transmit electromagnetic radiation impinging thereupon to the photosensitive elements. These nanowires can be fabricated from bulk silicon which appears gray in color, although researchers have patterned the surface of silicon so it "looks" black and does not reflect any visible light.

However, nanowires configured to selectively absorb (or to lower the reflectance of) light at a predetermined wavelength have not been fabricated.

SUMMARY

According to an embodiment, a method for fabricating a nanowire comprises: selecting a particular wavelength of electromagnetic radiation for absorption for a nanowire; determining a diameter corresponding to the particular wavelength; and fabricating a nanowire having the determined diameter.

According to an embodiment, there may be a nearly linear relationship between the nanowire diameter and the wavelength of electromagnetic radiation absorbed by the nanowire. However, it will be appreciated that other relationships may exists, based on the nanowire materials, fabrication techniques, cross-sectional shape, and/or other parameters. Based on the diameter of the nanowire, the particular wavelength of light absorbed may be within the UV, VIS or IR spectra.

According to an embodiment, the nanowire may be fabricated to have a diameter between about 90 and 150 nm for absorbing a wavelength of visible light. Of course, the nanowire diameters may need to be smaller for absorbing wavelengths of UV light or larger for absorbing wavelengths of IR light. While this disclosure primarily describes nanowires having a circular cross-sectional shape, it will appreciated that other cross-sectional shapes are also possible (e.g., those that function as a waveguide).

According to an embodiment, the length of the nanowire may be, for example, between about 1 and 10 µm (or perhaps even longer). The longer the nanowire is, the greater the volume may be available for absorption of electromagnetic energy.

According to an embodiment, the nanowire may be fabricated by a dry etching process, or a vapor-liquid-solid (VLS) method from a silicon or indium arsenide wafer. It will be appreciated, though, that other materials and fabrication techniques may also be used. During fabrication of the nanowire, a mask having the diameter of the nanowire may be used to form the nanowire having substantially the same diameter.

According to an embodiment, a plurality of nanowires may be fabricated into an array, each having the same or different determined diameters. The size of the array may be about 100 µm×100 µm or larger. And the nanowires can be spaced at a pitch of about 1 µm or less in the x- and y-directions (Cartesian). In one implementation, the array may include about 10,000 or more nanowires.

According to an embodiment, the spacing (pitch) of the nanowires may affect the amount of absorption. For instance, near total absorption may be realized by adjusting the spacing.

According to an embodiment, an image sensor comprises: a plurality of pixels, each of the pixels including at least one nanowire, wherein each of the nanowires has a diameter that corresponds to a predetermined wavelength of electromagnetic radiation for absorption by the sensor. The pixels may include one or more nanowires having the same or different determined diameters. The latter configuration may be effective for detecting absorbing multiple wavelengths of electromagnetic radiation (light). For instance, a red-green-blue (RGB) pixel for an image sensor may be fabricated having three nanowires having different diameters configured to absorb red, green and blue light, respectively.

According to an embodiment, the image sensor may include various elements, such as, foreoptics configured to receive the electromagnetic radiation and focus or collimate the received radiation onto the one or more pixels, a readout circuit configured to receive output from the one or more pixels, a processor configured to receive the output from the readout circuit and generate an image, and a display device configured to display the image generated by the processor. In some implementations, the image sensor may be configured as a spectrophotometer or as a photovoltaic cell.

According to an embodiment, a method of imaging comprises: receiving electromagnetic radiation; selectively absorbing, via one or more nanowires, at least one predetermined wavelength of electromagnetic radiation, wherein each of the nanowires has a diameter corresponding to at least one predetermined wavelength of electromagnetic radiation for absorption. The method may be used for performing multispectral imaging or hyperspectral imaging.

Other features of one or more embodiments of this disclosure will seem apparent from the following detailed description, and accompanying drawings, and the appended claims.

BRIEF DESCRIPTION OF THE DRAWINGS

Embodiments of the present disclosure will now be disclosed, by way of example only, with reference to the accompanying schematic drawings in which corresponding reference symbols indicate corresponding parts, in which.

DETAILED DESCRIPTION

Figure 1A:
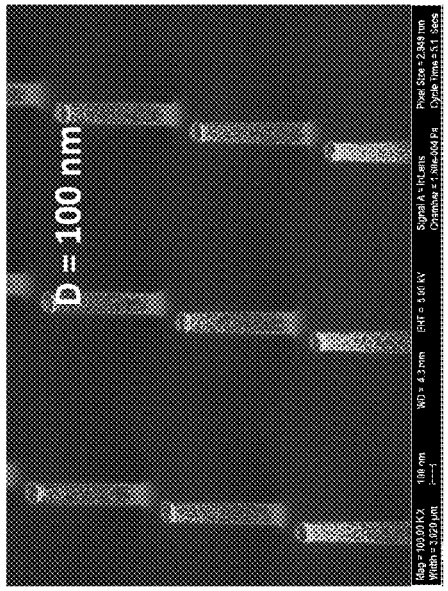
FIGS. 1A-1G are scanning electron microscope (SEM) images showing nanowire arrays of various diameters, according to an embodiment.
Figure 1B:
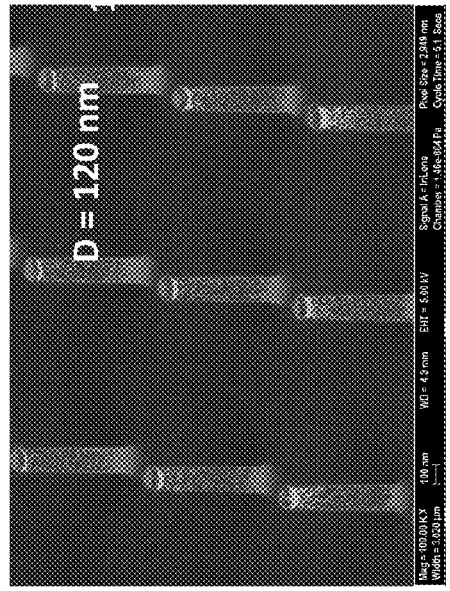
Figure 1C:
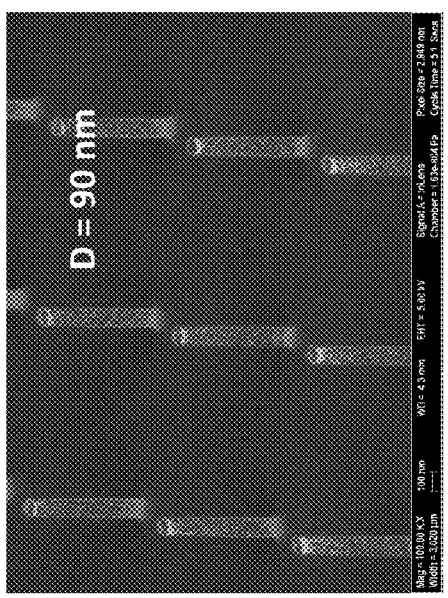
Figure 1D:
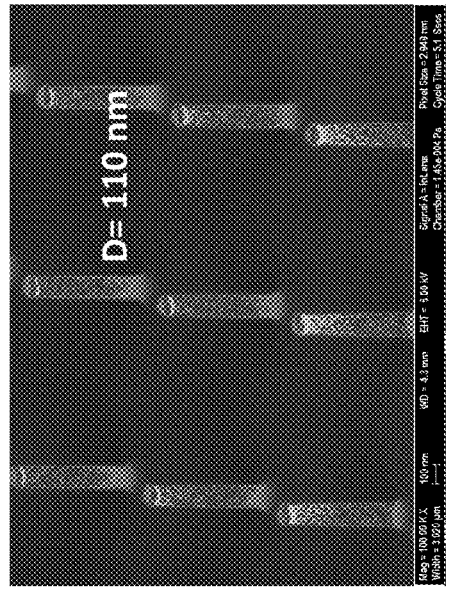
Figure 1E:
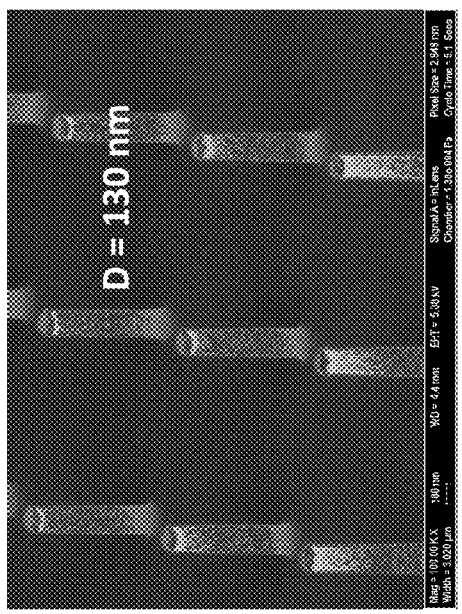
Figure 1F:
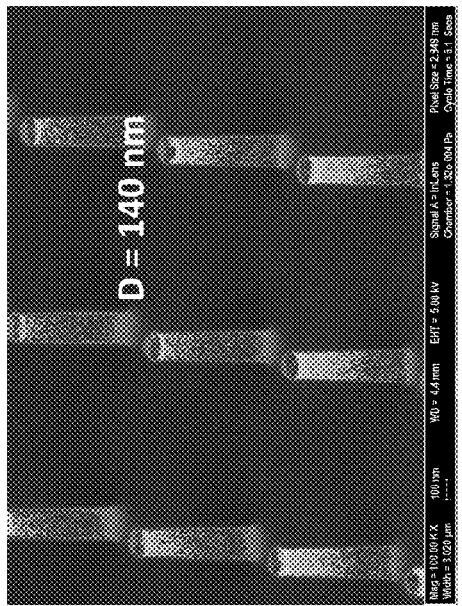
Figure 1G:
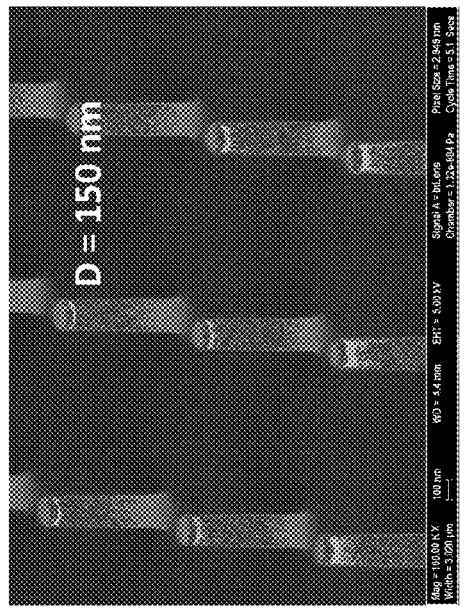

In the following detailed description, reference is made to the accompanying drawings, which form a part thereof. In the drawings, similar symbols typically identify similar components, unless the context dictates otherwise. The illustrative embodiments described in the detail description, drawings, and claims are not meant to be limiting. Other embodiments may be utilized, and other changes may be made, without departing from the spirit or scope of the subject matter presented here.

This disclosure is drawn to, among other things, methods, apparatuses, systems, and devices relating to the fabrication of one or more nanowires. Each of the nanowires may be fabricated to absorb (or to significantly lower reflectance of) a specific wavelength of electromagnetic radiation (light). This absorbed light includes a wavelength of light in one of the ultraviolet (UV), visible (VIS) or infrared (IR) spectra.

Figure 8:
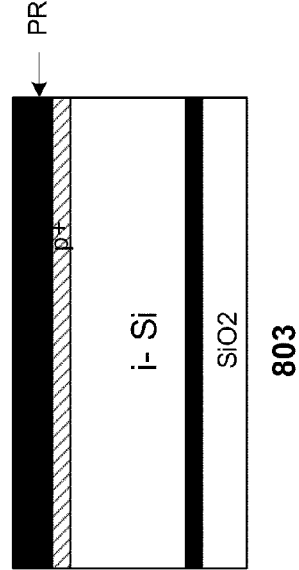
FIG. 8 shows an exemplary dry etch method for fabricating an array of vertical nanowires, according to an embodiment.
Figure 8:
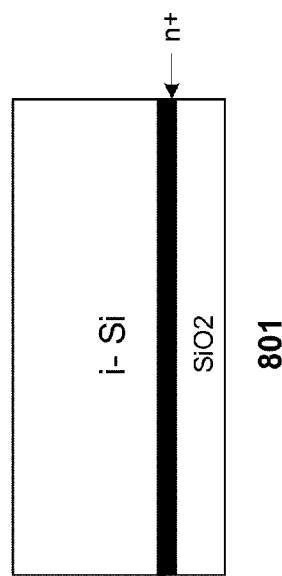
Figure 8:
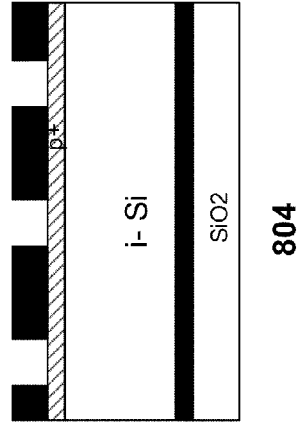
Figure 8:
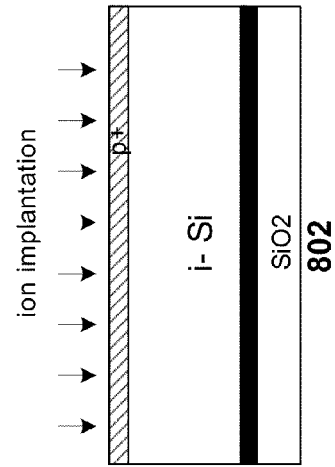
Figure 8:
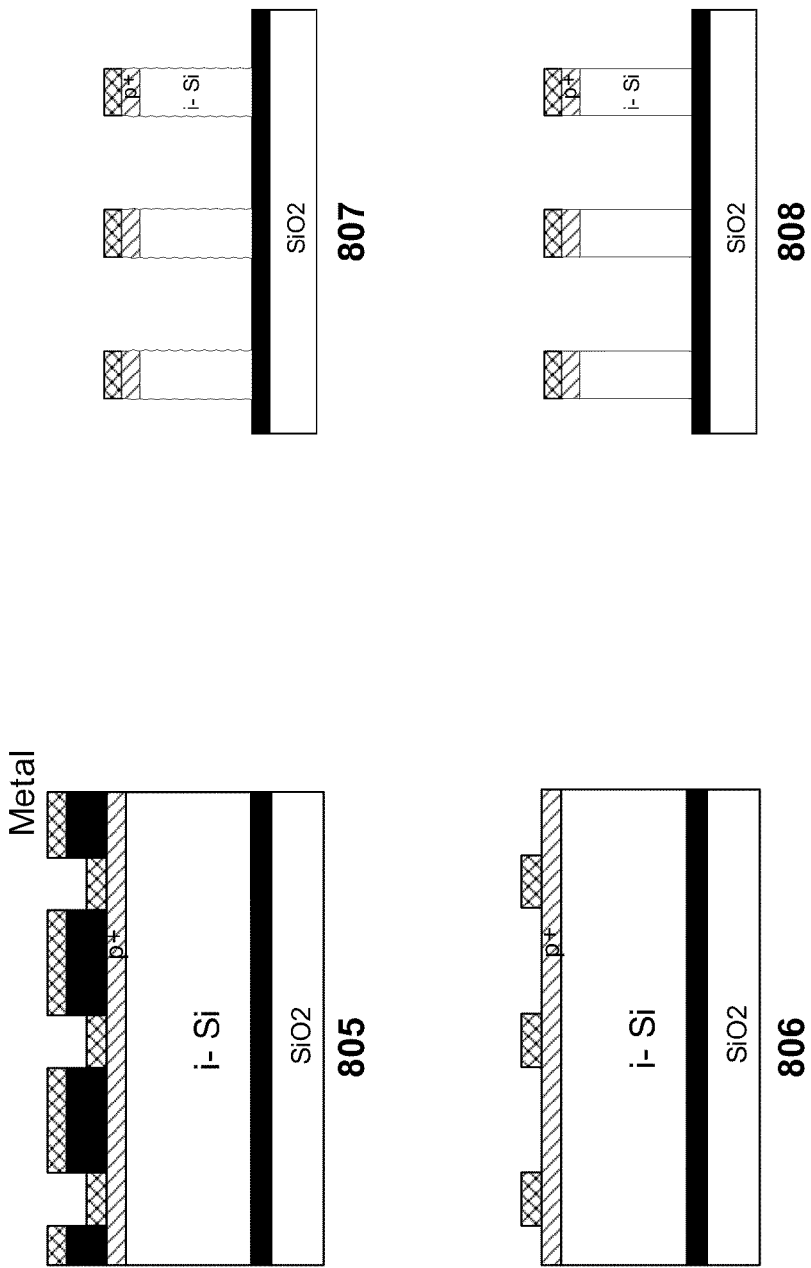
Figure 9:
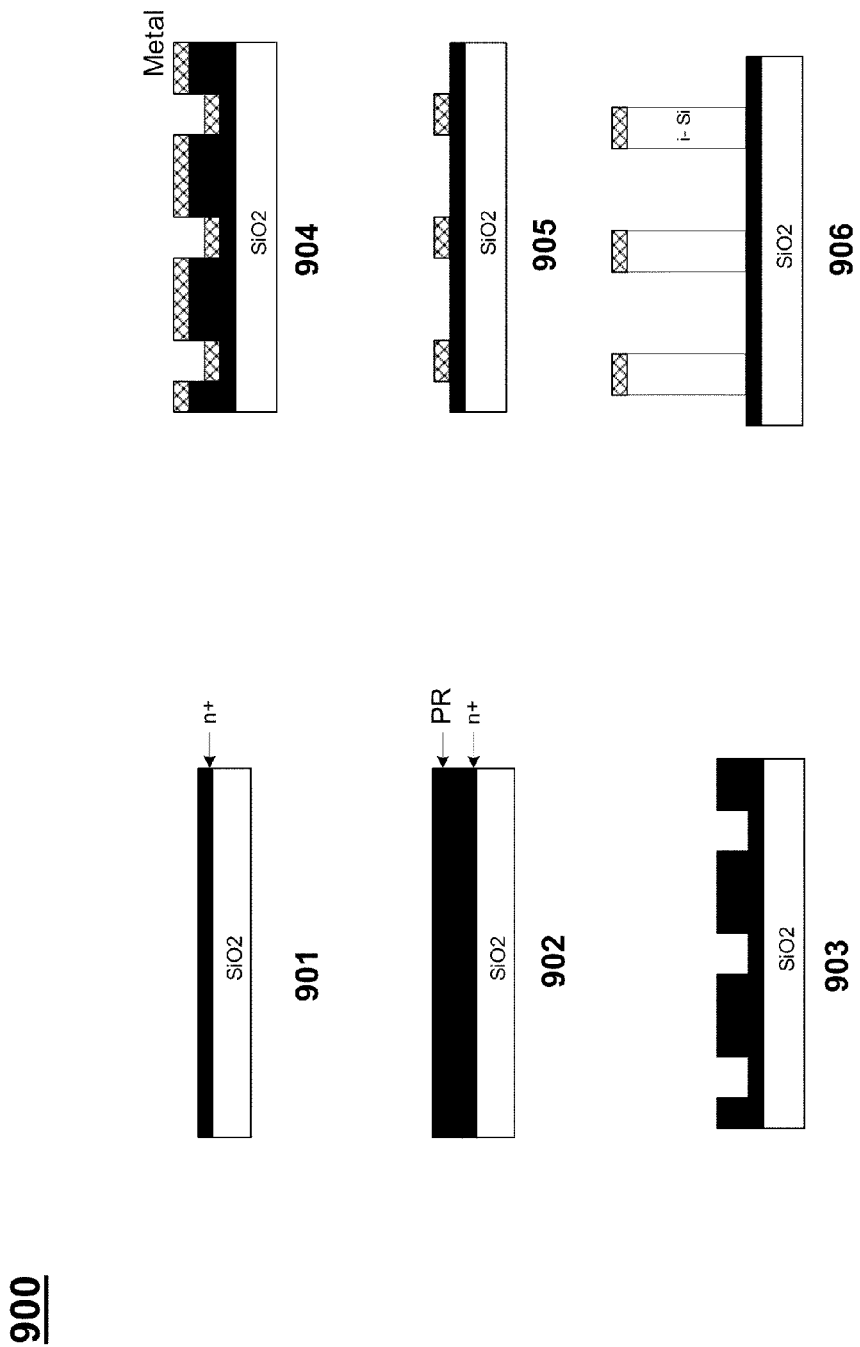
FIG. 9 shows an exemplary vapor liquid solid method for fabricating an array of vertical nanowires, according to an embodiment.

Silicon-based nanowires may be used for VIS applications. Vertically aligned crystalline silicon (Si) nanowire arrays may be fabricated, in various one embodiments, for example, by a dry etching process (as shown in FIG. 8 and further discussed below), or a Vapor Liquid Solid (VLS) growth method (as shown in FIG. 9 and further discussed below), with a silicon wafer as the starting material.

Of course, it will be appreciated that other materials and/or fabrication techniques may also be used for fabricating the nanowires in keeping with the scope of the invention. For instance, nanowires fabricated from an indium arsenide (InAs) wafer or related materials could be used for IR applications.

Each nanowire can include a photodiode detector element that may form a pixel in an image sensor. For example, a silicon-on-insulator (SOI)-type wafer or silicon-on-glass (SG) wafer may be used as the substrate material for which one or more nanowires may be formed upon. Depending on its configuration, the nanowire may be fabricated, such that: (i) the substrate may have an intrinsic epitaxial (epi) layer and a thin n+ layer at the oxide interface; (ii) the substrate may have a lightly doped n epi layer and a thin n+ layer at the oxide interface. (iii) the substrate may have lightly doped p epi layer and a thin p+ layer at the oxide interface, or (iv) the substrate may have an intrinsic epi layer and a thin p+ layer at the oxide interface.

P+ or n+ ion implantation may be employed to form a shallow junction at the top layer of the SOI or SG wafer. As a result, the vertical structure of p-i-n, p-n, n-i-p, n-p diode is formed respectively, depending on the substrate doping profile. In some instances, one or more transistors may be formed on the wafer for controlling the photocharge transfer from the nanowire to a readout circuit (ROC) and/or other electronics.

According to an aspect of the disclosure, the inventors have discovered a unique correlation between the nanowire diameter and its absorption (or reflectance) characteristics. For instance, the reflection spectra of fabricated silicon nanowire arrays each show a spectral dip for reflectance (or peak for absorption) at a specific wavelength position dependent on the nanowire diameter.

While the experiments performed by the inventors used nanowires fabricated having a circular cross-section, it is believed that the cross-section shape of the nanowire could be any polygonal shape, in keeping with the scope of the invention. The nanowire may be any "waveguide" shape, although the shape might have some impact on wavelength absorption.

Also, with different nanowire spacing (pitch), absorption intensity selectivity can be realized. For instance, by adjusting the spacing of adjacent nanowire, near total absorption may be realized.

The nanowire diameter may be determined by the diameter of a mask used in the process by which the nanowires are fabricated. In one implementation, the mask be formed of aluminum (Al). Of course, it will be appreciated that other mask materials can also be used.

A filtering effect can be employed in image sensor devices based on nanowire diameters. For instance, one or more nanowire arrays may be used to selectively absorb electromagnetic radiation (light) at a particular wavelength. While the incident light may be white (or other colors), absorption is "selected" by the size and/or arrangement of the nanowires. For example, the individual nanowires of the array may be fabricated to absorb light of one or more particular colors in the VIS spectrum, such as, for example, violet (400 nm), blue (475 nm), cyan (485 nm), green (510 nm), yellow (570 nm), orange (590 nm), and red (650 nm). Other absorbed colors are also possible, including black.

Similarly, individual nanowires of the array may be fabricated to absorb light in at least one wavelength of various bands of the IR spectrum, such as, for example, near-infrared (NIR), short-wavelength infrared (SWIR), mid-wavelength infrared (MWIR), long-wavelength infrared (LWIR) or far infrared (FIR).

In one implementation, a plurality of nanowire arrays may also be configured for multispectral imaging or hyperspectral imaging, which detect electromagnetic (light) over multiple discrete spectral bands and/or spectra (e.g., VIS, NIR, SWIR, MWIR, LWIR, FIR, etc). The nanowire arrays may be configured for spectral-selective imaging which detect one or more specific wavelength of electromagnetic radiation (light). In one embodiment, an image sensor may be fabricated from an array of nanowires with one or more nanowires forming each pixel of the sensor.

FIGS. 1A-1G are scanning electron microscope (SEM) images showing nanowire arrays of various diameters, according to an embodiment.

Vertical nanowire or nanopillar arrays may be fabricated, for example, by a dry etch method. Although, it will be appreciated that the nanowires may similarly fabricated using a VLS growing method, or other fabrication techniques. The nanowires may be formed in a Cartesian (x-y) matrix structure so that each nanowire can be controlled or individually addressed.

As shown, the nanowire arrays may be fabricated to have a very uniform circular cross-sectional shape, for instance, of about 1 to 3 µm in length or more. Using the VLS growing method, nanowires 10 µm in length can be grown. Longer nanowires may be able to absorb more radiation as they have a larger volume for the same given diameter. In addition, it may be possible to confine more radiation for absorption, for instance, using a cladding material deposited around the nanowires.

Each of the arrays shown includes nanowires formed from silicon having the same diameters ranging from about 90 to 150 nm. This diameter range may be effective for absorbing various wavelengths (colors) of visible light. Of course, the nanowire diameters may need to be smaller for absorbing wavelengths of UV light or larger for absorbing wavelengths of IR light.

The size of each of the array may be about 100 µm×100 µm, having 10,000 nanowires at a pitch (spacing) of about 1 µm or less in the x- and y-directions (in a Cartesian plane). Of course, the nanowire arrays may be fabricated in larger sizes, for instance, having a million or more nanowires. The nanowires may be spaced apart at different (larger) intervals and/or forming different shapes, as well.

Figure 2:
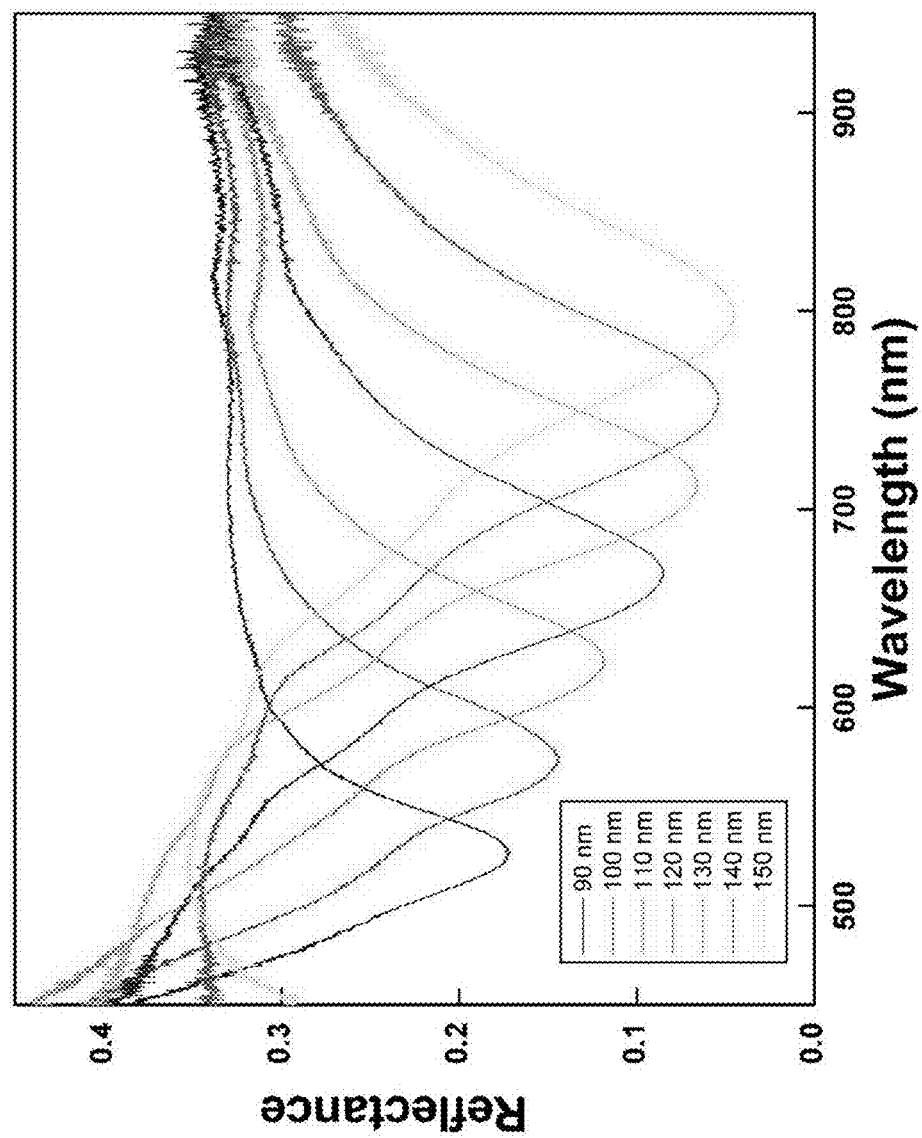
FIG. 2 shows a plot of reflection for silicon nanowires having different diameters, but having the same pitch, according to an embodiment.

FIG. 2 shows a plot of reflectance spectra for nanowires having different diameters, but having the same pitch, according to an embodiment.

The measured reflectance spectra were obtained using a collimated light method to measure reflectance of light from the nanowire array. The reflectance was normalize with respect to a silver (Ag) mirror. For each nanowire diameter, there is a significant dip in reflectance at a particular wavelength. This reflectance dip corresponds to absorption of light at that particular wavelength.

The bandwidth of the reflectance dip (or peak in absorption) is approximately 50-100 nm at the particular wavelength.

Figure 3B:
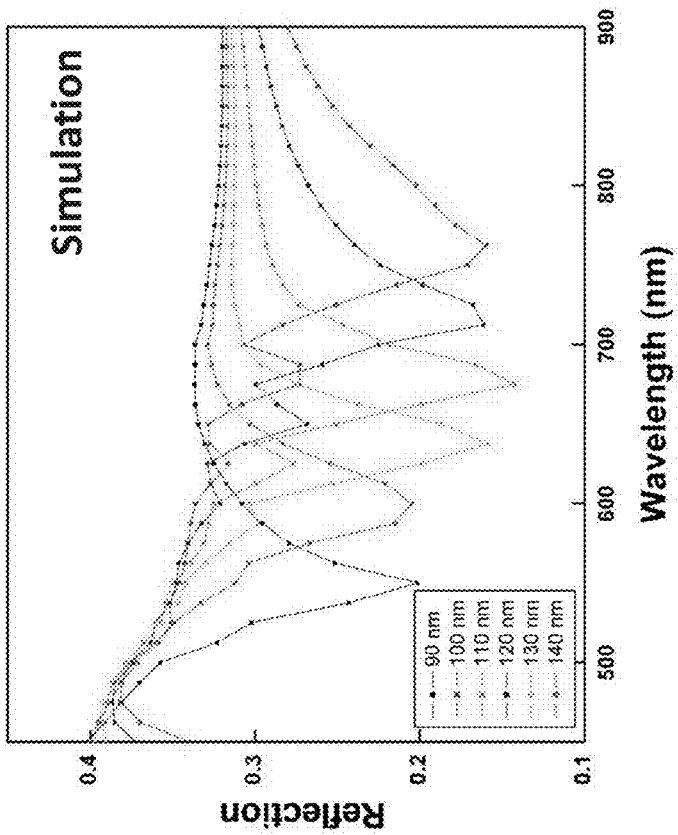
FIGS. 3A-3C show experimental and simulation results for reflection of silicon nanowire arrays, according to an embodiment
Figure 3A:
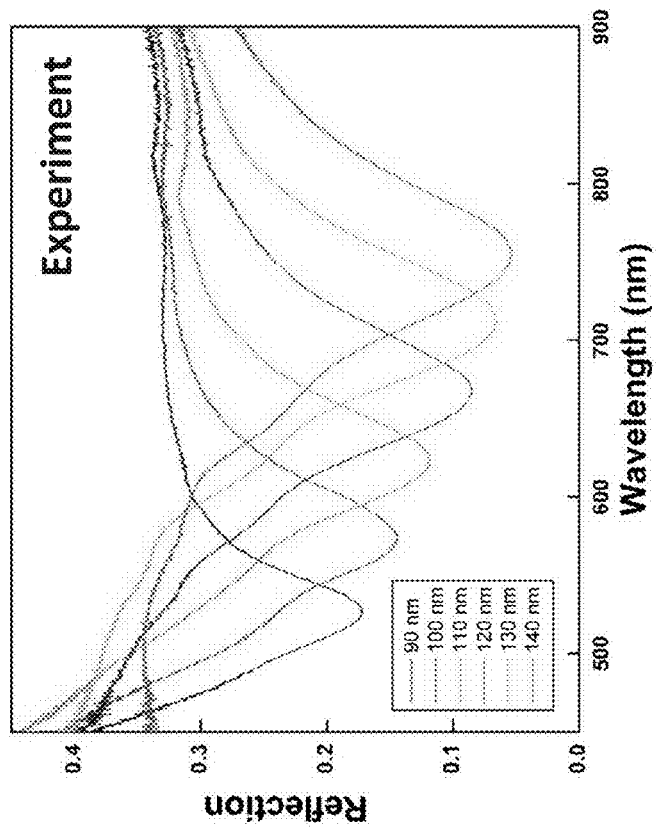
Figure 3C:
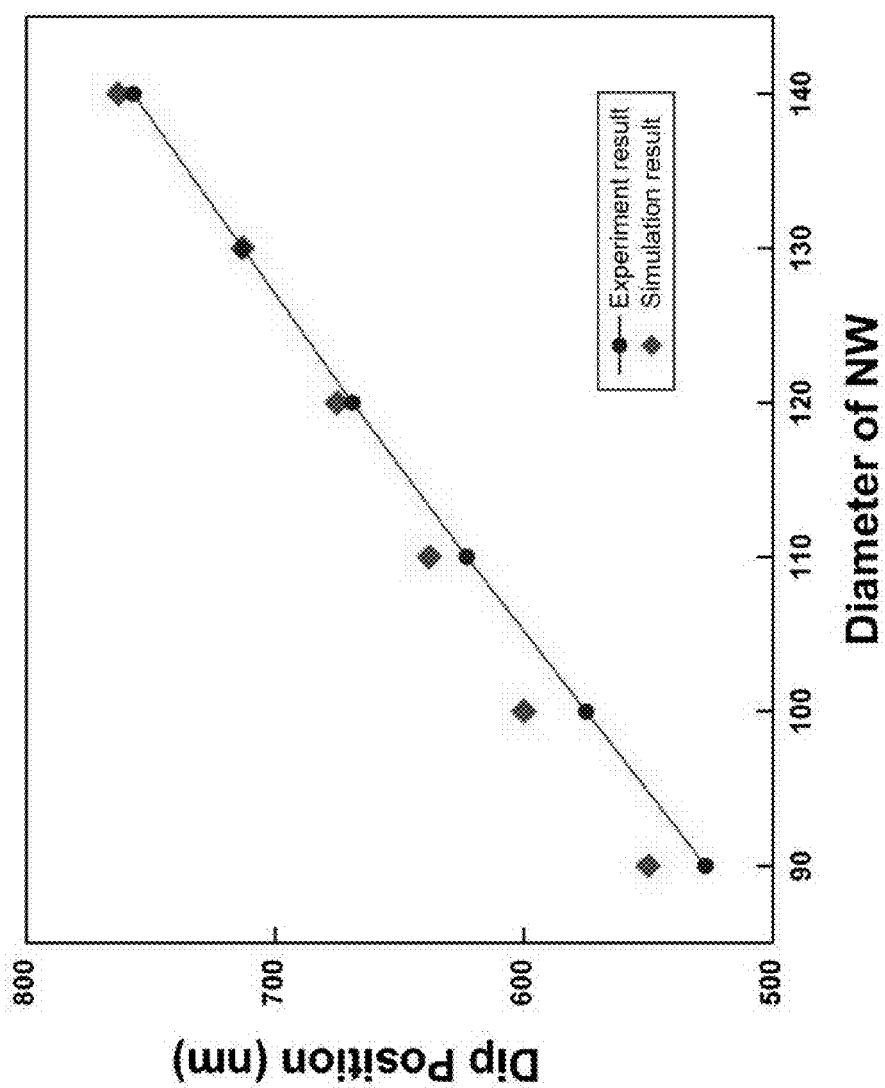

FIGS. 3A-3C show experimental and simulated results for reflection of Si nanowire arrays, according to an embodiment.

FIG. 3A shows similar experimental results shown in FIG. 2, but the measured reflectance spectra were obtained using a Raman spectroscopy setup configured to measure reflectance of light focused onto the nanowire array. The reflectance was normalized with respect to a silver (Ag) mirror. For each nanowire diameter, there is a significant dip in reflectance at a particular wavelength. This reflectance dip corresponds to absorption of light at that particular wavelength.

FIG. 3B shows simulated results. The computer-simulated results were obtained by finite difference time domain (FDTD) simulations.

In this case, two different mathematical techniques for solving Maxwell's equations were employed. The first employs a technique of numerically solving for the optical modes (eigenvalues and eigenmodes) of the nanowire array. The second numerical technique employed the FDTD approach wherein a simulated illuminant is propagated through the nanowire array. The FDTD technique is a grid-based numerical modeling method in which time-dependant Maxwell's equations (in partial differential form) are discretized using central-difference approximation to the space and time partial derivations. The resulting finite-difference equations for the electric field vector components are solved at a given instance in time, and then the magnetic field vector components are solved in the next instance of time. This processing is repeated over and over until a steady-state behavior is evolved.

There is a strong correlation between the dip position for reflectance and the diameter of the nanowires for both the experimental and simulated results. Although, for small diameter nanowire (e.g., less than about 200 nm), the simulation appears to indicate a single mode confinement.

FIG. 3C more clearly shows the correlation between the dip positions and nanowire diameter for the experimental results and the simulation results. There is a nearly linear correlation between nanowire diameter and the wavelength for the spectral dip position for reflectance (or the peak for absorption) for the nanowire.

Experimental data appears to confirm that for certain nanowire spacing the relationship is linear, especially for silicon nanowires. However, without being bound by theory, the inventors do not rule out the possibility of non-linear effects that are small in magnitude and/or that might have a larger impact using different materials or under different fabrication conditions. Simulation, for example, shows that for larger diameter nanowires (greater than about 200 nm), if the spacing is too close, that there may be multimode coupling. As such, the relationship might not be linear.

Figure 4:
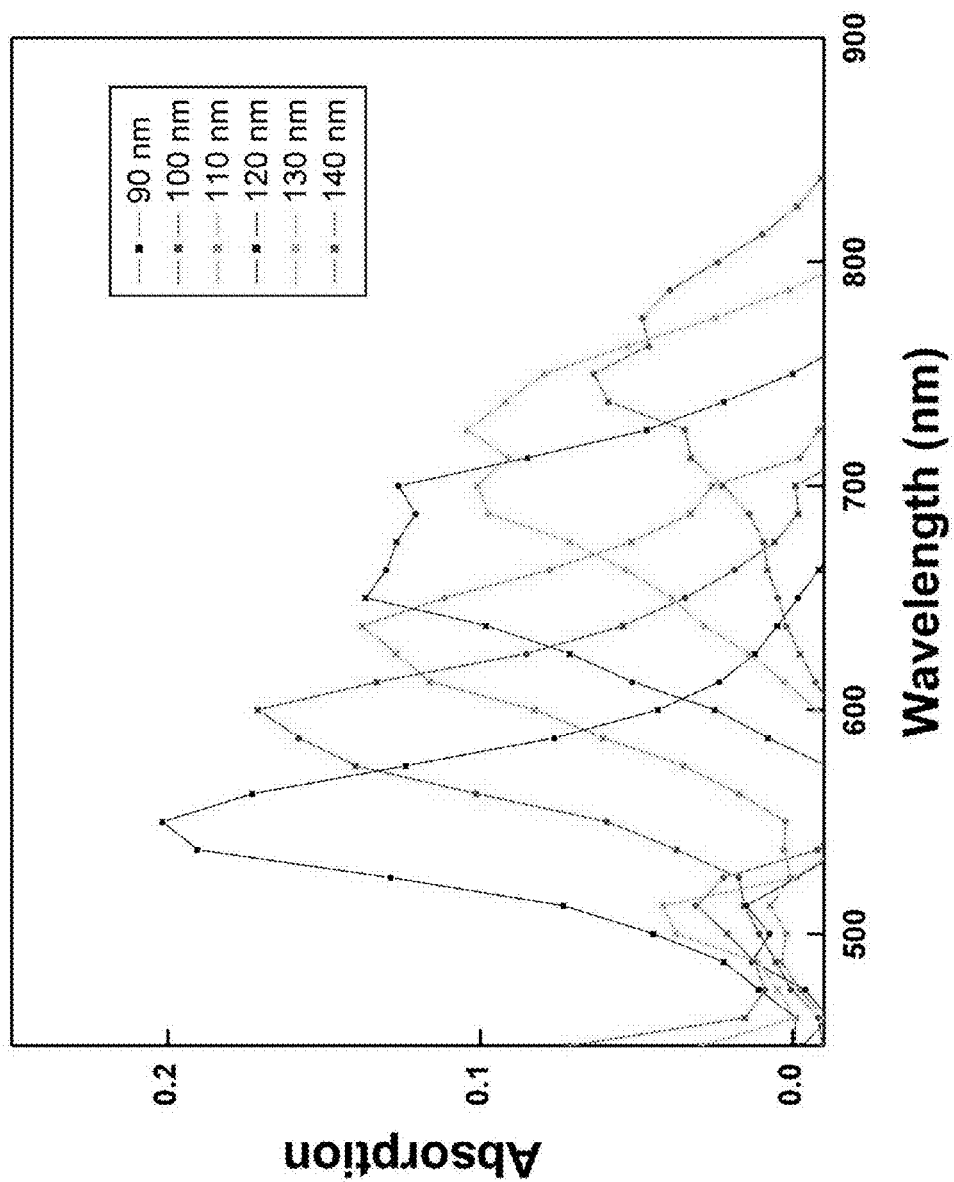
FIG. 4 shows a plot of absorption spectra of silicon nanowire arrays, according to an embodiment.

FIG. 4 shows a plot of absorption spectra of Si nanowire arrays, according to an embodiment. There is clearly a peak absorption for each nanowire diameter, which corresponds to the spectral dip of reflection shown in FIG. 2.

Figure 5:
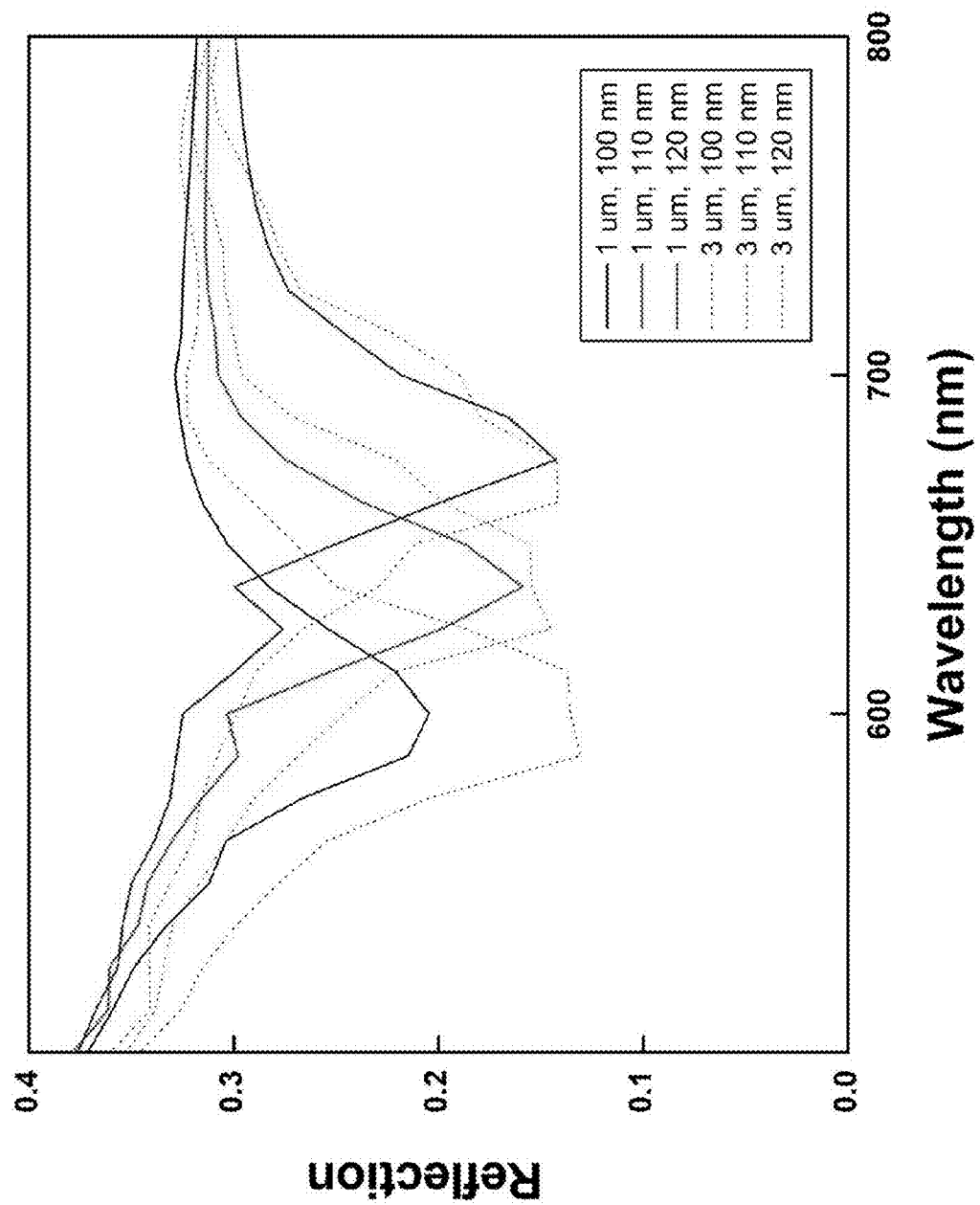
FIG. 5 shows a plot of reflection spectra of silicon nanowire arrays, according to an embodiment.

FIG. 5 shows a plot of reflection spectra of Si nanowire arrays, according to an embodiment. This plot shows reflectance spectrum for nanowires of a length of 3 µm, while in FIGS. 2 and 4, the reflectance spectra shown are for nanowires having a length of 1 µm.

Both nanowires of 1 and 3 µm lengths, generally showed a spectral dip in reflectance at the same wavelength for the same nanowire diameter. Although, for at least the smaller nanowire diameter of 100 nm, the 3 µm length nanowire experienced a much larger dip in reflectance than the 1 µm length nanowire. The larger length nanowires have a greater volume, which in turn results in higher radiation absorption.

Figure 6:
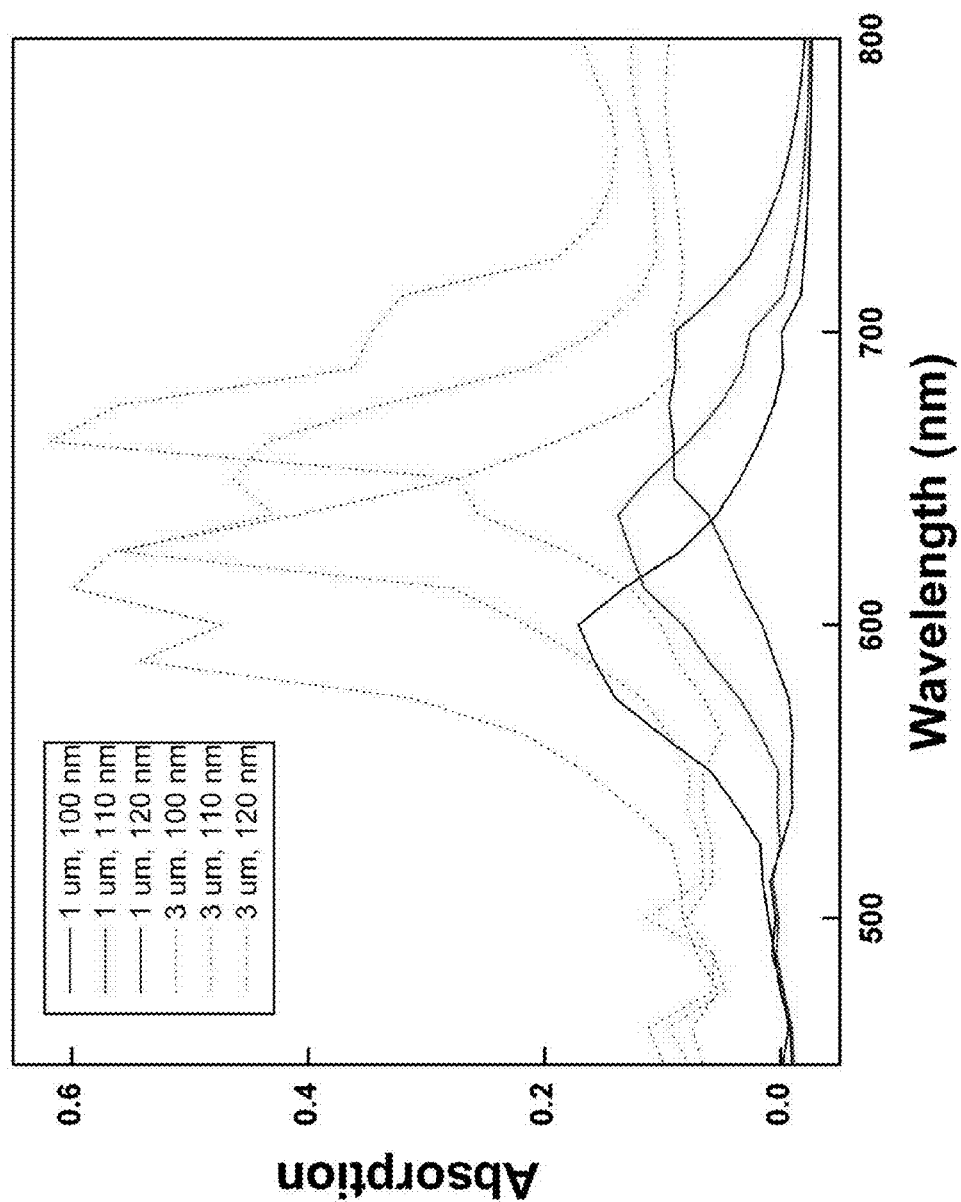
FIG. 6 shows a plot of absorption spectra of silicon nanowire arrays, according to an embodiment.

FIG. 6 shows a plot of absorption spectra of Si nanowire arrays, according to an embodiment. This plots show a comparison of the absorption spectrum for nanowires which are 1 µm and 3 µm in length.

Both nanowires of 1 and 3 µm lengths, generally showed an increase in absorption at the same wavelength for the same diameter. However, the nanowires of 3 µm length all showed a significant increase over the nanowires of 1 µm in length.

Figure 7:
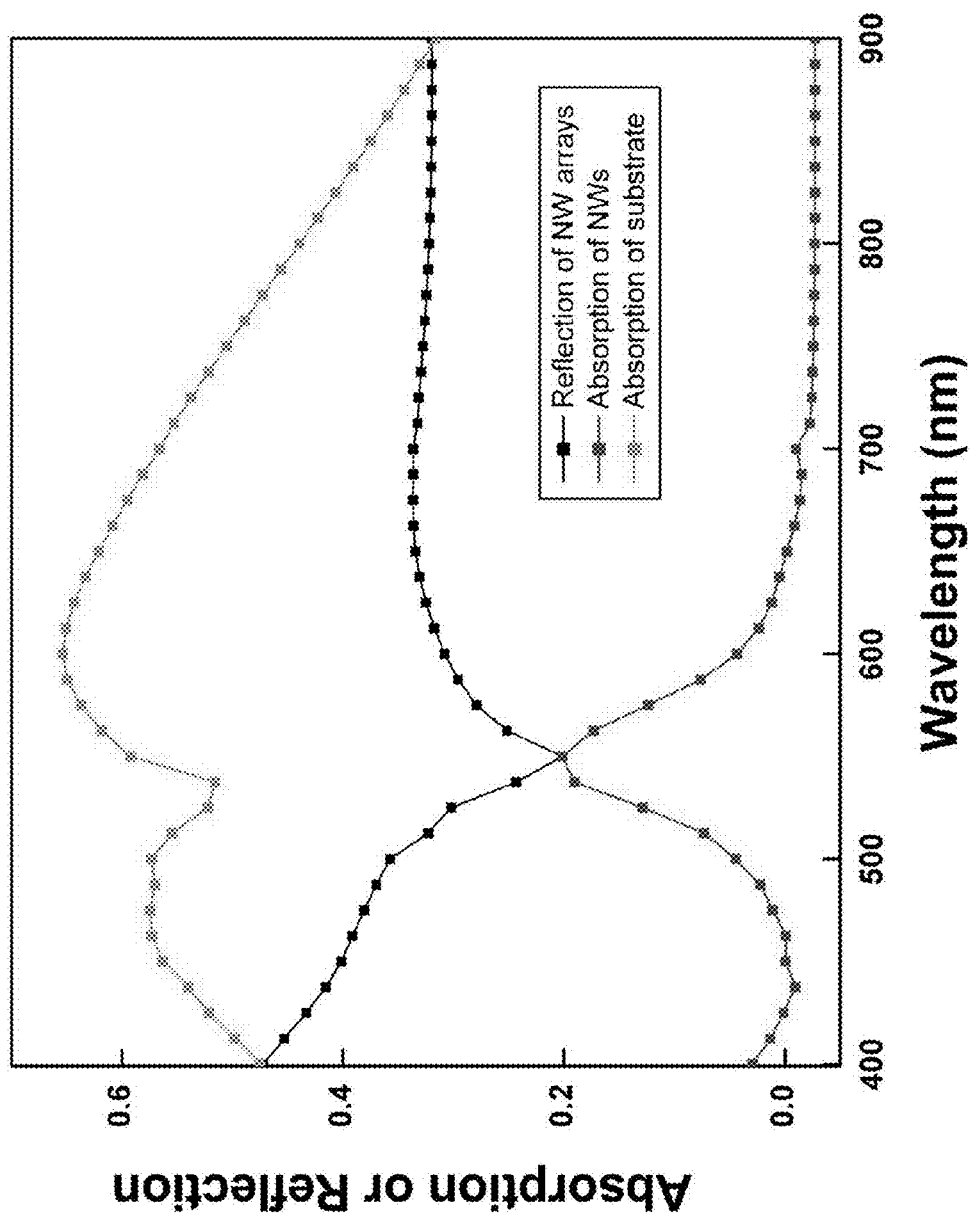
FIG. 7 shows a plot of absorption and reflection spectra of silicon nanowire arrays, according to an embodiment.

FIG. 7 shows a plot of absorption and reflection spectra of Si nanowire arrays, according to an embodiment. This plot shows absorption and reflectance spectrum for nanowire arrays having nanowires of 1 µm in length. As is apparent, the absorption and reflection are inversely correlated, with a dip in reflectance corresponding to a peak in absorption at the same wavelength. The substrate also shows a similar phenomenon at the same wavelength. The dip in substrate absorption is actually due to the nanowire absorption at that wavelength (peak). This is atypical behavior for an ordinary silicon wafer.

FIG. 8 shows an exemplary dry etch method 800 for fabricating an array of vertical nanowires, according to an embodiment.

In step 801, a starting material is provided which may include a SOI (silicon on insulator) substrate with an intrinsic epi layer and n+ type layer at the oxide interface. In one instance, the thickness of the i-layer and n+-layer may be 5 μm and 0.5 μm, respectively. In an alternative implementation, the starting substrate may have a lightly doped n-type epi-layer instead of the intrinsic epi-layer layer.

Next, in step 802, a shallow p+ type layer is formed by an ion implantation with p-type dopant and minimum energy. Photoresist (PR) is deposited on the p+ layer in step 803 for the preparation of lithography. And, in step 804, the PR is patterned, for instance, by employing the electron beam (or e-beam) lithography technique.

Metal deposition commences in step 805, for example, by either evaporation or sputtering method. One metal that may be used in the fabrication, for example, is aluminum. A lift-off etch method is then employed in step 806 for removing the PR and any unwanted metal on it.

In step 807, a dry etch is performed using the metal pattern as a etch mask. For applying the dry etch on the silicon material, etching gases such as, for instance, octafluorocyclobutane ($C_4F_8$) and sulfur hexafluoride ($SF_6$) can be used. An array of circular pillars (nanowires) are formed by the etch process. The diameter of the etch mask determines the diameter of the pillars which form each nanowire. In one implementation, the etch mask may be formed of aluminum.

Since the surfaces of the etched pillars may be rough, a surface treatment may be needed to make surfaces smooth. Thus, in step 808, the pillar surfaces may be dipped briefly in an etchant, such as, potassium hydroxide (KOH) and a cleaning performed afterwards.

In some embodiments, a readout circuit may further be fabricated in connection with to the n+ layer, to control and individually address each nanowire in the array. The readout circuit may include a plurality of switching transistors, with one or more switching transistors provided for selectively controlling or addressing each nanowire.

FIG. 9 shows an exemplary VLS method 900 for fabricating an array of vertical nanowires, according to an embodiment.

In step 901, a starting material is provided which may include a SOI or SG substrate with an n+ type layer on top of the $SiO_2$. Next, in step 902, PR is deposited for the preparation of the lithography. The PR may patterned in step 903, for instance, by employing the electron beam lithography technique. Metal deposition commences in step 904 by either evaporation or sputtering method. Metals that may be used in the fabrication are gold or aluminum. In step 905, a lift-off etch method is employed for removing the PR and any unwanted metal on it.

Continuing to step 906, intrinsic type nanowires are grown employing a VLS method. In an alternative embodiment, lightly doped n-type nanowires can be grown instead of the intrinsic nanowires. The diameter of the metal mask (applied in step 904) determines the diameter of the pillars which form each nanowire grown ins step 906. In a subsequent step (not shown), a CMP technique may be employed to planarize the top surface and remove the metal.

In some embodiments, a readout circuit may further be fabricated in connection with to the n+ layer, to control and individually address each nanowire in the array. The readout circuit may include a plurality of switching transistors, with one or more switching transistors provided for selectively controlling or addressing each nanowire.

Figure 10:
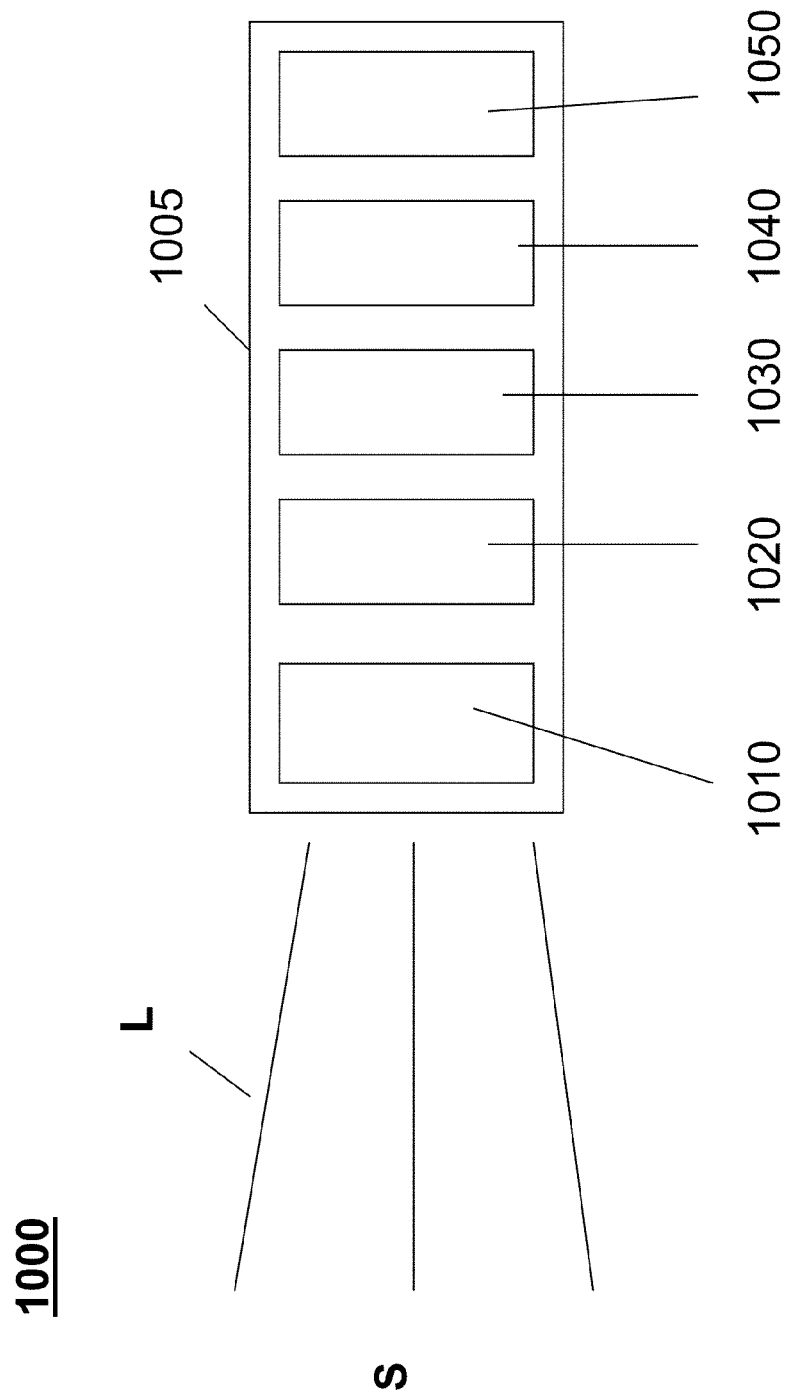
FIG. 10 shows a schematic of an image sensor, according to an embodiment.

FIG. 10 shows a schematic of an image sensor 1000 in accordance with an embodiment.

The image sensor 1000 generally includes foreoptics 1010, an array of pixels 1020, a readout circuit (ROC) 1030, a processor 1040 and a display device 1050. A housing 1005 may incorporate one of more the foregoing elements of the sensor 1000, and protects the elements from excessive/ambient light, the environment (e.g., moisture, dust, etc.), mechanical damage (e.g., vibration, shock), etc.

Electromagnetic radiation (light) L from a scene S emanates toward the image sensor 1000. For clarity, only light L from the scene S impinging upon the sensor 1000 is depicted (although it will be appreciated that light L from the scene S radiates in all directions).

The foreoptics 1010 may be configured to receive the electromagnetic radiation (light) L from the scene S and focus or collimate the received radiation onto the array of pixels 1020. for instance, foreoptics 1010 may include, for instance, one or more of: a lens, an optical filter, a polarizer, a diffuser, a collimator, etc.

The array of pixels 1020 may be fabricated from an array of one or more nanowires, as disclosed above (see FIG. 8 or 9). Each of the pixels may include one or more nanowires having a diameter that corresponds to a predetermined wavelength of electromagnetic radiation (light) L for absorption by the sensor 1000. At least one of the nanowires in the array may have a different determined diameter than another of the nanowire in the array. This enables multiple wavelength absorption (and detection).

The ROC 1030 may be connected to the array of pixels 1020 and is configured to receive output from the pixels 1020. The ROC 1030 may include one or more switching transistors connected to the nanowires for selectively controlling or addressing each pixel of the array 1020.

The processor 1040 is configured to receive output from the ROC 1030 and generate an image for viewing on the display device 1050. The processor 1040 may, in some instances, be configured to provide data scaling, zooming/magnification, data compression, color discrimination, filtering, or other imaging processing, as desired.

In one embodiment, the processor 1040 may include hardware, such as Application Specific Integrated Circuits (ASICs), Field Programmable Gate Arrays (FPGAs), digital signal processors (DSPs), or other integrated formats. However, those skilled in the art will recognize that the processor 1040 may, in whole or in part, can be equivalently implemented in integrated circuits, as one or more computer programs having computer-executable instructions or code running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one skilled in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of computer-readable medium used to actually carry out the distribution.

The display device 1050 may include any device configured for displaying image data. Exemplary displays may include a cathode ray tube (CRT), plasma, liquid crystal display (LCD), light emitting diode (LED) display, pen chart, etc. In some instance, the display device 1050 may, alternatively or additionally, include a printer or other device for capturing the displayed image. In addition, the image data may be output to an electronic memory (not shown) for storage.

In some implementations, the image sensor 1000 may be configured as a spectrophotometer to measure intensity of reflection or absorption at one more wavelengths.

In other implementations, the image sensor 1000 could be configured as a photovoltaic device. By adjusting the spacing of the nanowires, it may be possibly to nearly control all various wavelengths of a spectrum, without any reflection.

Figure 11:
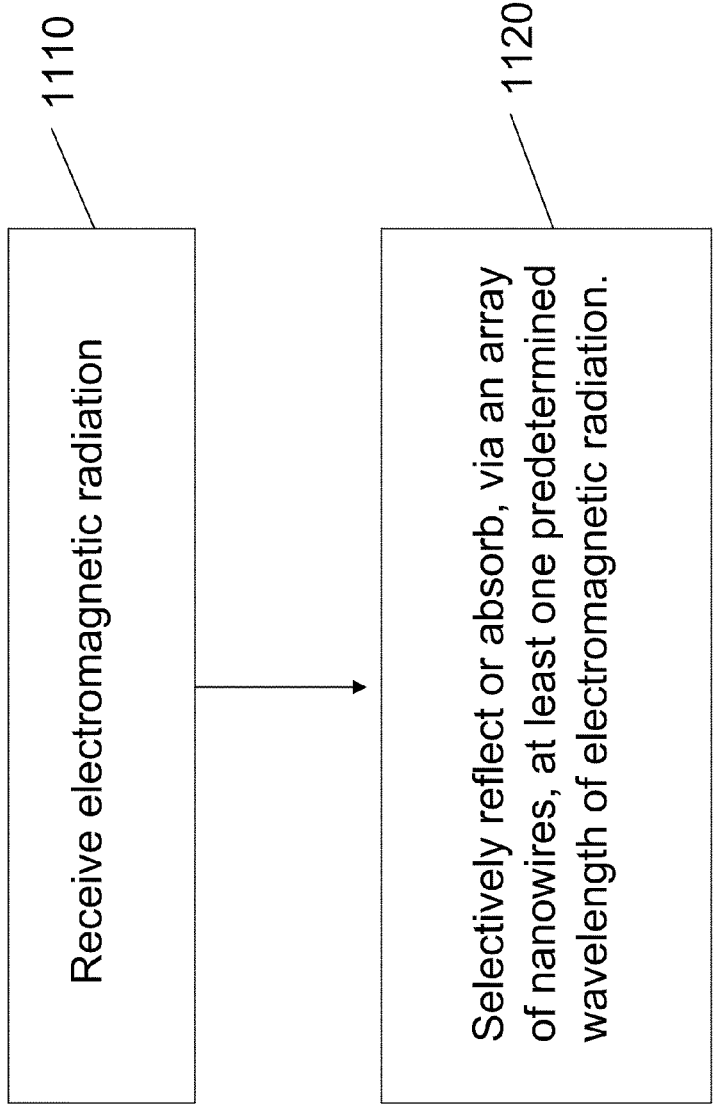
FIG. 11 shows a method for selectively imaging, according to an embodiment.

FIG. 11 shows a method 1100 for selectively imaging, according to an embodiment.

In step 1110, electromagnetic radiation (light) may be received, for instance, using the image sensor 1000 (FIG. 10). Next, in step 1120, the array 1020 of the image sensor 1000 may selectively absorb at least one predetermined wavelength of electromagnetic radiation (light). Method 1100 may be used for multispectral imaging or hyperspectral imaging applications.

Depending on the construction of the nanowire array, multiple wavelengths of electromagnetic radiation (light) may be absorbed and/or detected by selectively providing nanowires of different diameters. A three-nanowire pixel element may be fabricated. Of course, pixels having additional nanowires are also possible.

Figure 12:
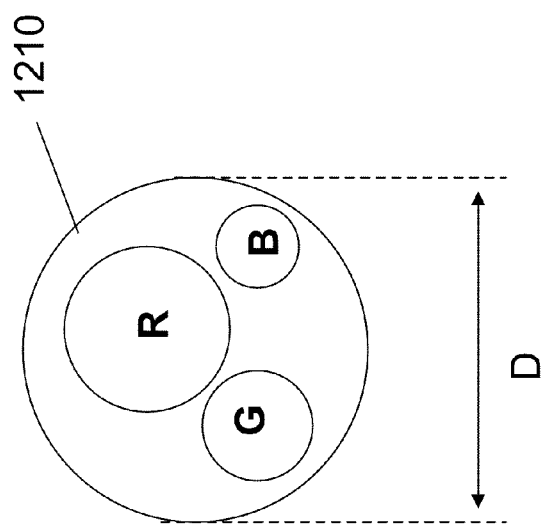
FIG. 12 shows an exemplary pixel of an image sensor formed of three nanowires having different diameters configured to absorb red, green, and blue light, respectively, according to an embodiment.

FIG. 12 shows an exemplary pixel 1200 formed of three nanowires R, G, B having different diameters configured to absorb red, green, and blue light, according to an embodiment. For instance, the R, G, B nanowires can have diameters configured to absorb wavelengths of about 650 nm, 510 nm, and 475 nm, respectively (see, e.g., FIG. 3C).

An array can be fabricated from a plurality of pixels 1200. In one implementation, the effective diameter D of the pixel 1200 may be 1 μm or less. A cladding 1210 may, in some instance, surround the pixel 1200 to increase absorption of the nanowires.

The foregoing detailed description has set forth various embodiments of the devices and/or processes by the use of diagrams, flowcharts, and/or examples. Insofar as such diagrams, flowcharts, and/or examples contain one or more functions and/or operations, it will be understood by those within the art that each function and/or operation within such diagrams, flowcharts, or examples can be implemented, individually and/or collectively, by a wide range of hardware, software, firmware, or virtually any combination thereof.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for fabricating a nanowire comprising:
   selecting a particular wavelength of electromagnetic radiation for absorption for a nanowire;
   determining a diameter corresponding to the particular wavelength, wherein the nanowire with the determined diameter has an absorption peak of electromagnetic radiation at the particular wavelength; and
   fabricating the nanowire having the determined diameter.

2. The method according to claim 1, the particular wavelength is within one of the ultraviolet (UV), visible (VIS) or infrared (IR) spectra.

3. The method according to claim 1, wherein the diameter of the nanowire is between about 90 and 150 nm, and the particular wavelength is in the visible spectrum.

4. The method according to claim 1, wherein the length of the nanowire is between about 1 and 10 μm.

5. The method according to claim 1, wherein there is a nearly linear relationship between nanowire diameter and the wavelength of electromagnetic radiation for absorption of the nanowire.

6. The method according to claim 1, wherein the nanowire is fabricated by a dry etching process or a vapor-liquid-solid (VLS) method.

7. The method according to claim 1, wherein the nanowire is fabricated from a silicon or indium arsenide wafer.

8. The method according to claim 1, wherein fabricating the nanowire comprises using a mask having the diameter.

9. The method according to claim 1, further comprising:
   fabricating an array of nanowires, wherein at least one of the nanowires in the array has the same or a different determined diameter than another of the nanowires in the array.

10. The method according to claim 1, wherein the cross-sectional shape of the nanowire is substantially circular.

11. The method according to claim 1, the nanowire is fabricated upon the substrate and the substrate is a silicon-on-insulator or silicon-on-glass substrate.

12. The method according to claim 1, further comprising depositing a cladding material around the nanowire.

13. The method according to claim 1, further comprising fabricating an array of nanowires.

14. The method according to claim 11, wherein, (i) the substrate has an intrinsic epitaxial (epi) layer and a thin n+ layer at an oxide interface; (ii) the substrate has a lightly doped n epi layer and a thin n+ layer at an oxide interface. (iii) the substrate has a lightly doped p epi layer and a thin p+ layer at an oxide interface, or (iv) the substrate has an intrinsic epi layer and a thin p+ layer at and oxide interface.

15. The method according to claim 11, wherein p+ or n+ ion implantation is employed to form a shallow junction at a top layer of the substrate to formed one of a p-i-n, p-n, n-i-p, n-p diode.

16. The method according to claim 11, wherein one or more transistors are formed on the substrate for controlling the photocharge transfer from the nanowire to a readout circuit (ROC) or other electronics.

17. The method of claim 1, wherein the nanowire is essentially vertical to a substrate.

18. The method according to claim 13, wherein size of the array is about 100 μm×100 μm or larger.

19. The method according to claim 13, wherein the nanowires are spaced apart at a pitch of about 1 μm or less in the x- and y-directions.

20. The method of claim 13, wherein the nanowire is essentially vertical to a substrate.

\* \* \* \* \*